United States Patent
Park et al.

(10) Patent No.: US 12,402,479 B2
(45) Date of Patent: Aug. 26, 2025

(54) DISPLAY APPARATUS

(71) Applicant: Samsung Display Co., Ltd., Yongin-si (KR)

(72) Inventors: Hyungjun Park, Yongin-si (KR); Junyong An, Yongin-si (KR); Nuree Um, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 604 days.

(21) Appl. No.: 17/840,195

(22) Filed: Jun. 14, 2022

(65) Prior Publication Data
US 2023/0165053 A1   May 25, 2023

(30) Foreign Application Priority Data

Nov. 22, 2021   (KR) ........................ 10-2021-0161487

(51) Int. Cl.
| | |
|---|---|
| *H10K 59/121* | (2023.01) |
| *G09G 3/3233* | (2016.01) |
| *H10D 86/40* | (2025.01) |
| *H10D 86/60* | (2025.01) |
| *H10K 59/123* | (2023.01) |
| *H10K 59/131* | (2023.01) |

(52) U.S. Cl.
CPC ....... *H10K 59/1213* (2023.02); *H10K 59/123* (2023.02); *H10K 59/131* (2023.02); *G09G 3/3233* (2013.01); *G09G 2300/0426* (2013.01); *G09G 2300/0842* (2013.01); *H10D 86/441* (2025.01); *H10D 86/60* (2025.01)

(58) Field of Classification Search
CPC .. H10K 59/121; H10K 59/123; H10K 59/131; H10K 59/1213; H10K 59/352; H10D 86/423; H10D 86/60; H10D 86/441; H10D 86/481; G09G 2300/0426; G09G 3/3233; G09G 2300/0842
See application file for complete search history.

(56) References Cited

U.S. PATENT DOCUMENTS

| | | | |
|---|---|---|---|
| 10,878,743 B2 | 12/2020 | Cho et al. | |
| 11,217,653 B2* | 1/2022 | Kwak | ................. G09G 3/3266 |

(Continued)

FOREIGN PATENT DOCUMENTS

| | | |
|---|---|---|
| CN | 206451466 | 8/2017 |
| CN | 110874990 | 3/2020 |

(Continued)

*Primary Examiner* — Vinh T Lam

(57) ABSTRACT

A display apparatus includes a substrate including a first region and a second region including an outer pixel area that overlaps an outer column spaced apart from the first region, a first outer pixel circuit, a second outer pixel circuit and an intermediate pixel circuit disposed in the outer pixel area, a first display element including a first outer display element and a second outer display element, wherein the first outer display element overlaps a first inner column overlapping at least a portion of the first region and is connected to the first outer pixel circuit, and the second outer display element overlaps a second inner column and is connected to the second outer pixel circuit, and a second display element including an intermediate display element overlapping the outer pixel area and connected to the intermediate pixel circuit.

20 Claims, 18 Drawing Sheets

(56) References Cited

U.S. PATENT DOCUMENTS

| | | | |
|---|---|---|---|
| 11,238,777 B2* | 2/2022 | Kim | G02F 1/136286 |
| 11,239,446 B2* | 2/2022 | Chung | H10K 77/111 |
| 11,296,180 B2* | 4/2022 | Kim | G09G 3/3291 |
| 11,437,440 B2* | 9/2022 | Yuan | H10K 59/126 |
| 11,456,350 B2* | 9/2022 | Kim | H04N 23/51 |
| 11,495,624 B2* | 11/2022 | Lee | H10D 86/441 |
| 11,552,146 B2* | 1/2023 | Lee | G09G 3/3233 |
| 11,574,966 B2* | 2/2023 | Bae | H10K 59/60 |
| 11,641,767 B2* | 5/2023 | Chae | H10K 59/131 257/40 |
| 11,653,523 B2* | 5/2023 | Lee | G06F 3/04164 345/174 |
| 11,670,238 B2* | 6/2023 | Kim | H10K 77/10 345/55 |
| 11,672,153 B2* | 6/2023 | Chae | H10K 59/123 257/40 |
| 11,700,748 B2* | 7/2023 | Kim | H10K 50/858 257/40 |
| 11,723,255 B2* | 8/2023 | Hong | H10K 50/865 345/156 |
| 11,770,960 B2* | 9/2023 | Choe | G02B 5/22 |
| 11,785,828 B2* | 10/2023 | Hong | H10K 59/8791 |
| 11,793,055 B2* | 10/2023 | Yoo | H10K 59/126 345/156 |
| 11,800,770 B2* | 10/2023 | Kim | H10K 59/353 |
| 11,810,504 B2* | 11/2023 | Cheng | H10K 59/131 |
| 11,818,918 B2* | 11/2023 | Kim | H10K 50/865 |
| 11,832,479 B2* | 11/2023 | Kang | H10K 59/121 |
| 11,847,970 B2* | 12/2023 | Du | H10K 59/353 |
| 11,849,605 B2* | 12/2023 | Choi | H10K 71/233 |
| 11,871,601 B2* | 1/2024 | Chae | H10K 59/122 |
| 11,895,881 B2* | 2/2024 | Kim | H10K 59/353 |
| 11,899,862 B2* | 2/2024 | Bok | H10K 59/121 |
| 11,915,634 B2* | 2/2024 | Du | H10K 59/1213 |
| 11,930,678 B2* | 3/2024 | Jeon | H10K 59/121 |
| 11,974,481 B2* | 4/2024 | Jung | H10K 59/88 |
| 11,978,395 B2* | 5/2024 | Zhang | G09G 3/3233 |
| 11,985,874 B2* | 5/2024 | Cai | H10K 59/131 |
| 11,991,910 B2* | 5/2024 | Du | G09G 3/3225 |
| 12,016,230 B2* | 6/2024 | Chae | G09G 3/3233 |
| 12,062,330 B2* | 8/2024 | Yin | G09G 3/3208 |
| 12,094,419 B2* | 9/2024 | Xiang | G09G 3/2074 |
| 12,133,432 B2* | 10/2024 | Cheng | H10K 59/88 |
| 12,136,389 B2* | 11/2024 | Du | H10K 59/131 |
| 12,200,979 B2* | 1/2025 | Park | H10K 59/124 |
| 12,207,506 B2* | 1/2025 | Seo | H10K 59/1213 |
| 12,213,355 B2* | 1/2025 | Huang | G09G 3/3241 |
| 12,217,672 B2* | 2/2025 | Huang | G09G 3/3233 |
| 12,238,968 B2* | 2/2025 | Liu | H10K 59/352 |
| 12,261,193 B2* | 3/2025 | Sun | H10H 20/857 |
| 12,262,608 B2* | 3/2025 | Cai | H10K 59/121 |
| 12,268,062 B2* | 4/2025 | Ko | H10K 59/1213 |
| 12,272,776 B2* | 4/2025 | Wu | G09G 3/32 |
| 2020/0119304 A1* | 4/2020 | Choi | H10K 50/844 |
| 2020/0225828 A1* | 7/2020 | Jeong | G06F 1/1686 |
| 2020/0303478 A1* | 9/2020 | Lee | H10K 59/1216 |
| 2020/0410921 A1* | 12/2020 | Kim | G09G 3/3233 |
| 2021/0132715 A1 | 5/2021 | Shin et al. | |
| 2022/0149129 A1* | 5/2022 | Park | H10K 59/121 |
| 2022/0149135 A1* | 5/2022 | Choi | H10K 59/353 |
| 2022/0366847 A1* | 11/2022 | An | G09G 3/2003 |
| 2022/0384548 A1* | 12/2022 | Keum | H10K 59/123 |
| 2023/0040037 A1* | 2/2023 | Lee | H10K 59/131 |
| 2024/0395210 A1* | 11/2024 | An | G09G 3/3233 |

FOREIGN PATENT DOCUMENTS

| | | |
|---|---|---|
| CN | 111708199 | 9/2020 |
| CN | 111916486 | 11/2020 |
| KR | 10-2021-0051316 | 5/2021 |

\* cited by examiner

DISPLAY APPARATUS

CROSS-REFERENCE TO RELATED APPLICATION(S)

This application claims priority to and benefits of Korean Patent Application No. 10-2021-0161487 under 35 U.S.C. § 119, filed on Nov. 22, 2021, in the Korean Intellectual Property Office, the entire contents of which are incorporated herein by reference.

BACKGROUND

1. Technical Field

One or more embodiments relate to a display apparatus.

2. Description of the Related Art

Recently, the usage of display apparatuses has diversified. As display apparatuses have become thinner and lighter, their range of use has gradually been extended.

As the area occupied by an area that displays images in display apparatuses expands, various functions that are combined or associated with display apparatuses have been added. As alternatives for adding various functions, research has been carried out on a display apparatus having a component region for performing various functions while displaying images.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

A component area needs to maintain a high transmittance for light or sound to perform a function thereof. Accordingly, a pixel circuit that drives a display element may not be arranged in the component area. The pixel circuit for driving the display element may be arranged in an adjacent area that neighbors the component area not to overlap the component area.

The adjacent area may be a region in which the pixel circuit is arranged, and simultaneously, which displays images. However, in the case where the adjacent area is arranged only on one side of the component area, a user may recognize the adjacent area.

One or more embodiments include a display apparatus having a shape in which the adjacent area surrounds at least a portion of the outer periphery of the component area to reduce a user recognizing the adjacent area.

Additional aspects will be set forth in part in the description which follows and, in part, will be apparent from the description, or may be learned by practice of the presented embodiments of the disclosure.

According to one or more embodiments, a display apparatus may include a substrate including a first region; a second region; and a third region, the second region including an outer pixel area that overlaps an outer column spaced apart from the first region in a plan view and surrounding at least a portion of the first region, and the third region surrounding at least a portion of the second region; a first outer pixel circuit disposed in the outer pixel area; a second outer pixel circuit disposed in the outer pixel area, the second outer pixel circuit being disposed adjacent to the first outer pixel circuit in a first direction; an intermediate pixel circuit disposed in the outer pixel area, the intermediate pixel circuit being disposed adjacent to one of the first outer pixel circuit and the second outer pixel circuit in a second direction intersecting the first direction; a first display element including a first outer display element; and a second outer display element; and a second display element including an intermediate display element overlapping the outer pixel area and electrically connected to the intermediate pixel circuit, wherein the first outer display element overlaps a first inner column in a plan view, the first inner column overlaps at least a portion of the first region in a plan view, the first outer display element is electrically connected to the first outer pixel circuit, the second outer display element overlaps at least a portion of the first region and a second inner column different from the first inner column in a plan view, and the second outer display element is electrically connected to the second outer pixel circuit.

The display apparatus may further include a first outer data line extending along the outer column and electrically connected to the first outer pixel circuit; an intermediate data line extending along the outer column and electrically connected to the intermediate pixel circuit; and a first pixel circuit disposed in the third region to be adjacent to the outer pixel area and electrically connected to the intermediate data line.

The display apparatus may further include a first scan line electrically connected to each of the first outer pixel circuit and the second outer pixel circuit; a second scan line electrically connected to the intermediate pixel circuit; and a third scan line electrically connected to the first pixel circuit, wherein the first scan line and the second scan line may transfer a same scan signal.

The display apparatus may further include a second outer data line extending along the outer column and electrically connected to the second outer pixel circuit; an adjacent data line extending along the outer column; and a second pixel circuit disposed in the third region to be adjacent to the outer pixel area and electrically connected to the adjacent data line.

The second region may include a first inner pixel area overlapping the first inner column in a plan view, and the display apparatus may include a first outer data line extending along the outer column and electrically connected to the first outer pixel circuit; a second outer data line extending along the outer column and electrically connected to the second outer pixel circuit; a first inner data line electrically connected to the first outer data line and extending along the first inner column; a second inner data line electrically connected to the second outer data line and extending along the first inner column; a first inner pixel circuit disposed in the first inner pixel area and electrically connected to the first inner data line; and a second inner pixel circuit disposed in the first inner pixel area and electrically connected to the second inner data line, the second display element may include a first inner display element disposed in the first inner pixel area and electrically connected to the first inner pixel circuit, and one of the first display element and the second display element may include a second inner display element overlapping the second inner column in a plan view and electrically connected to the second inner pixel circuit.

The display apparatus may further include connection lines, each of the connection lines extending from the second region to the first region and each of the connection lines including a transparent conductive oxide, wherein a number of the connection lines disposed on a first row intersecting the outer column may be different from a number of the connection lines disposed on a second row different from the first row.

The display apparatus may further include an organic insulating layer disposed between the first outer pixel circuit and the first display element and including a first organic insulating layer, a second organic insulating layer, and a third organic insulating layer sequentially stacked each other, wherein the connection lines may include at least one of a lower connection line and an upper connection line, the lower connection line may be disposed between the first organic insulating layer and the second organic insulating layer, and the upper connection line may be disposed between the second organic insulating layer and the third organic insulating layer.

The display apparatus may further include a first connection line extending from the outer column to the second inner column and electrically connecting the second outer pixel circuit to the second outer display element; and a second connection line extending from the first inner column to the second inner column and electrically connecting the second inner pixel circuit to the second inner display element, wherein the first inner column may be disposed between the outer column and the second inner column.

The display apparatus may further include a third display element disposed in the third region and including an emission area smaller than at least one of an emission area of the first display element and an emission area of the second display element.

The second region may extend along an outer periphery of the first region.

According to one or more embodiments, a display apparatus may include a substrate including a first region; a second region; and a third region, the second region including an outer pixel area that overlaps an outer column spaced apart from the first region in a plan view and surrounding at least a portion of the first region, and the third region surrounding at least a portion of the second region; a first outer pixel circuit disposed in the outer pixel area; a second outer pixel circuit disposed in the outer pixel area, the second outer pixel circuit the first being disposed adjacent to the outer pixel circuit in a first direction; an intermediate pixel circuit disposed in the outer pixel area, the intermediate pixel circuit being disposed adjacent to one of the first outer pixel circuit and the second outer pixel circuit in a second direction intersecting the first direction; a first pixel circuit disposed in the third region to be adjacent to the outer pixel area; a first outer data line extending along the outer column and electrically connected to the first outer pixel circuit; a second outer data line extending along the outer column and electrically connected to the second outer pixel circuit; an intermediate data line extending along the outer column and electrically connected to each of the intermediate pixel circuit and the first pixel circuit; a first display element including a first outer display element and a second outer display element, the first outer display element being disposed in the first region and electrically connected to the first outer pixel circuit, and the second outer display element being electrically connected to the second outer pixel circuit; and a second display element including an intermediate display element disposed in the outer pixel area and electrically connected to the intermediate pixel circuit.

The display apparatus may further include a first scan line electrically connected to each of the first outer pixel circuit and the second outer pixel circuit; a second scan line electrically connected to the intermediate pixel circuit; and a third scan line electrically connected to the first pixel circuit, wherein the first scan line and the second scan line may transfer a same scan signal.

The display apparatus may further include an adjacent data line extending along the outer column; and a second pixel circuit disposed in the third region to be adjacent to the outer pixel area and electrically connected to the adjacent data line.

The first outer display element may overlap a first inner column in a plan view, the first inner column may overlap at least a portion of the first region in a plan view, and the second outer display element may overlap a second inner column in a plan view, and the second inner column may overlap at least a portion of the first region in a plan view and may be different from the first inner column.

The second region may include a first inner pixel area overlapping the first inner column in a plan view, and the display apparatus may include a first inner data line electrically connected to the first outer data line and extending along the first inner column; a second inner data line electrically connected to the second outer data line and extending along the first inner column; a first inner pixel circuit disposed in the first inner pixel area and electrically connected to the first inner data line; a second inner pixel circuit disposed in the first inner pixel area and electrically connected to the second inner data line, the second display element may include a first inner display element disposed in the first inner pixel area and electrically connected to the first inner pixel circuit, and one of the first display element and the second display element may include a second inner display element overlapping the second inner column in a plan view and electrically connected to the second inner pixel circuit.

The display apparatus may further include connection lines each extending from the second region to the first region and including a transparent conductive oxide, wherein a number of the connection lines disposed on a first row intersecting the outer column may be different from a number of the connection lines disposed on a second row different from the first row.

The display apparatus may further include an organic insulating layer disposed between the first outer pixel circuit and the first display element and including a first organic insulating layer, a second organic insulating layer, and a third organic insulating layer sequentially stacked each other, wherein the connection lines may include at least one of a lower connection line and an upper connection line, and the lower connection line may be disposed between the first organic insulating layer and the second organic insulating layer, and the upper connection line may be disposed between the second organic insulating layer and the third organic insulating layer.

The display apparatus may further include a first connection line extending from the outer column to the second inner column and electrically connecting the second outer pixel circuit to the second outer display element; and a second connection line extending from the first inner column to the second inner column and electrically connecting the second inner pixel circuit to the second inner display element, wherein the first inner column may be disposed between the outer column and the second inner column.

The display apparatus may further include a third display element disposed in the third region and including an emission area smaller than at least one of an emission area of the first display element and an emission area of the second display element.

The second region may extend along an outer periphery of the first region.

BRIEF DESCRIPTION OF THE DRAWINGS

The above and other aspects, features, and advantages of embodiments of the disclosure will be more apparent from the following description taken in conjunction with the accompanying drawings, in which.

DETAILED DESCRIPTION OF THE EMBODIMENTS

Figure 1A:
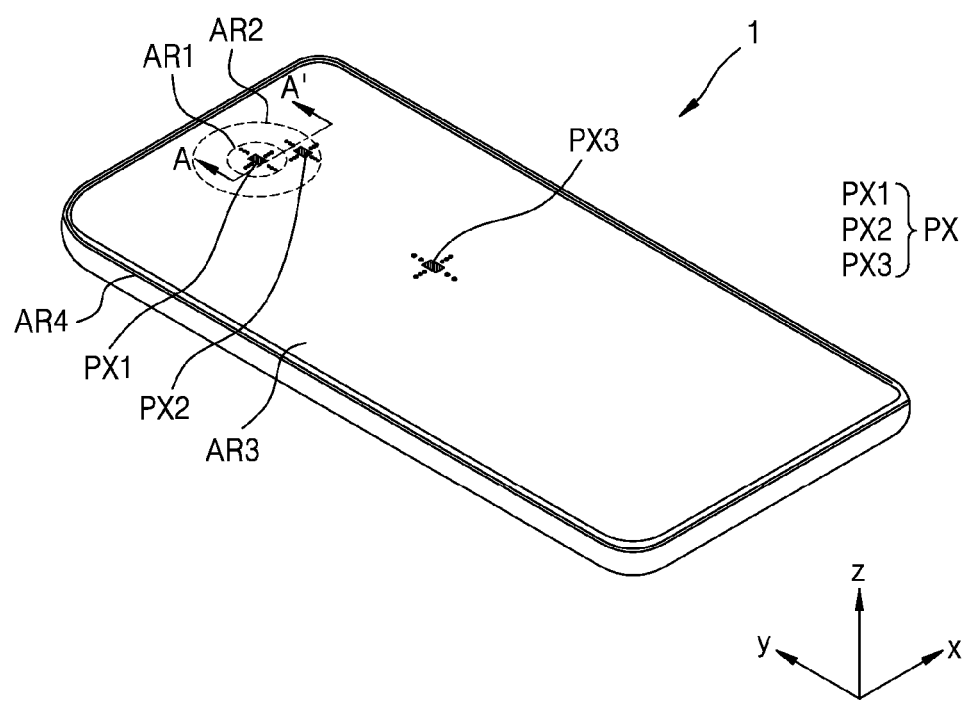
FIGS. 1A and 1B are schematic perspective views of a display apparatus according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are described below, by referring to the figures, to explain aspects of the description.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

Throughout the disclosure, the expression "at least one of a, b or c" indicates only a, only b, only c, both a and b, both a and c, both b and c, all of a, b, and c, or variations thereof.

As the disclosure allows for various changes and numerous embodiments, embodiments will be illustrated in the drawings and described in the written description. Effects and features of the disclosure, and methods for achieving them will be clarified with reference to embodiments described below in detail with reference to the drawings. However, the disclosure is not limited to the following embodiments and may be embodied in various forms.

Hereinafter, embodiments will be described with reference to the accompanying drawings, wherein like reference numerals refer to like elements throughout and a repeated description thereof is omitted.

While such terms as "first" and "second" may be used to describe various components, such components must not be limited to the above terms. The above terms are used to distinguish one component from another. For example, a first component may be referred to as a second component, and similarly, a second component may be referred to as a first component without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The singular forms "a," "an," and "the" as used herein are intended to include the plural forms as well unless the context clearly indicates otherwise.

It will be understood that the terms "comprise," "comprising," "include" and/or "including" "has," "have," and/or "having," and variations thereof when used in this specification, specify the presence of stated features or components but do not preclude the addition of one or more other features or components.

The phrase "in a plan view" means viewing the object from the top, and the phrase "in a schematic cross-sectional view" means viewing a cross-section of which the object is vertically cut from the side.

It will be further understood that, when a layer, region, or component is referred to as being "on" another layer, region, or component, it can be directly or indirectly on the other layer, region, or component. For example, intervening layers, regions, or components may be present.

Sizes of elements in the drawings may be exaggerated or reduced for convenience of explanation. For example, since sizes and thicknesses of elements in the drawings are arbitrarily illustrated for convenience of explanation, the disclosure is not limited thereto.

In the case where an embodiment may be implemented differently, a specific process order may be performed in the order different from the described order. As an example, two processes that are successively described may be substantially simultaneously performed or performed in the order opposite to the order described.

It will be understood that when a layer, region, or component is referred to as being "connected" to another layer, region, or component, it may be "directly connected" to the other layer, region, or component or may be "indirectly connected" to the other layer, region, or component with other layer, region, or component interposed therebetween. For example, it will be understood that when a layer, region, or component is referred to as being "electrically connected" to another layer, region, or component, it may be "directly electrically connected" to the other layer, region, or component or may be "indirectly electrically connected" to other layer, region, or component with other layer, region, or component interposed therebetween.

It will be further understood that the terms "connected to" or "coupled to" may include a physical or electrical connection or coupling.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1B:
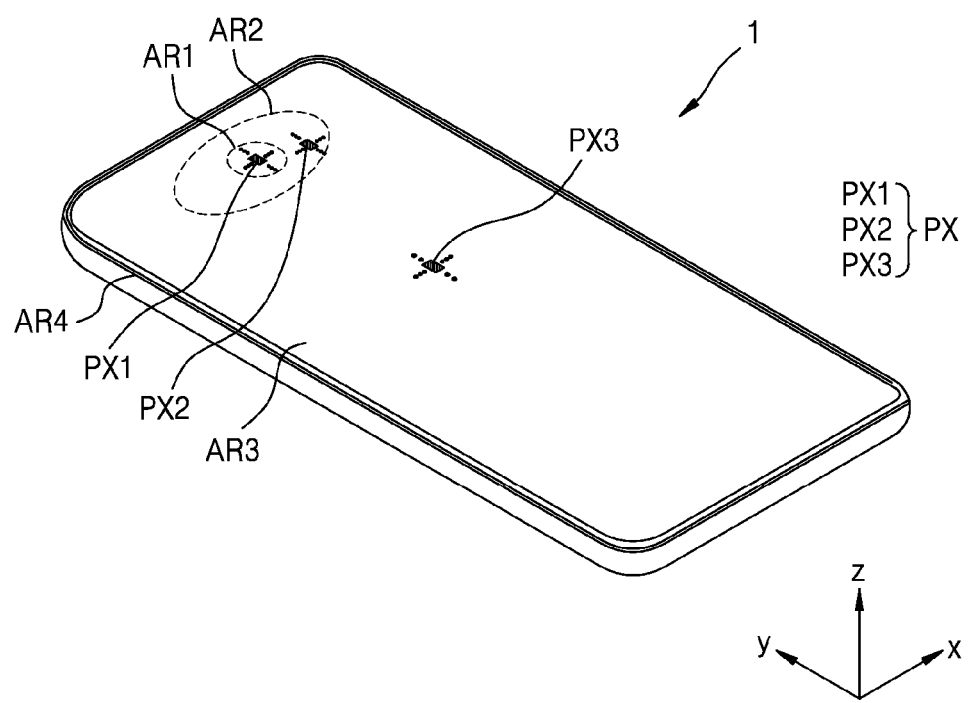

FIGS. 1A and 1B are perspective views of a display apparatus 1 according to an embodiment.

Referring to FIGS. 1A and 1B, the display apparatus 1 may display images. The display apparatus 1 may include a pixel PX. The pixel PX may be defined by a region through which a display element emits light. The pixel PX may be provided in plural in the display apparatus 1. The pixels PX may each emit light and display images. In an embodiment, the pixels PX may include a first pixel PX1, a second pixel PX2, and a third pixel PX3.

The display apparatus 1 may include a first area AR1, a second area AR2, a third area AR3, and a fourth area AR4. The pixels PX may be arranged (or disposed) in the first area AR1, the second area AR2, and the third area AR3. Accordingly, each of the first area AR1, the second area AR2, and the third area AR3 may be a display area. The pixels PX may not be arranged in the fourth area AR4. The fourth area AR4 may be a non-display area.

The first area AR1 may be a region which overlaps a component, and simultaneously, in which the pixels PX are arranged. The first pixel PX1 may be arranged in the first area AR1. In an embodiment, first pixels PX1 may be arranged in the first area AR1. Accordingly, the display apparatus 1 may overlap the component in the first area AR1 and display images.

Because the first area AR1 may be a region overlapping the component, the display apparatus 1 may have a high transmittance of light or sound in the first area AR1. As an example, a light transmittance of the first area AR1 in the display apparatus 1 may be about 10% or more, about 25% or more, about 40% or more, about 50% or more, about 85% or more, or about 90% or more. In an embodiment, a light or sound transmittance of the first area AR1 in the display apparatus 1 may be equal to or greater than a light or sound transmittance of the second area AR2 and the third area AR3 in the display apparatus 1.

At least one first area AR1 may be provided to the display apparatus 1. As an example, the display apparatus 1 may include one first area AR1 or include first areas AR1.

Though it is shown in FIGS. 1A and 1B that the first area AR1 has a circular shape, the first area AR1 may have various shapes such as an elliptical shape, a polygon, a star shape, or a diamond shape in an embodiment. Hereinafter, the case where the first area AR1 has a circular shape is described in detail. It is to be understood that the shapes disclosed herein may include shapes substantial to those shapes disclosed herein.

The second region AR2 may surround at least a portion of the first region AR1. As an example, the second region AR2 may surround the first region AR1 entirely. As another example, the second region AR2 may surround only a portion of the first region AR1. In an embodiment, the second area AR2 may extend along the outer periphery of the first area AR1. Referring to FIG. 1A, the outer periphery of the second area AR2 may have a substantially circular shape. In an embodiment, the outer periphery of the second area AR2 may have a polygonal shape overlapping a virtual circular shape. Referring to FIG. 1B, the outer periphery of the second area AR2 may have a substantially elliptical shape. In an embodiment, the outer periphery of the second area AR2 may have a polygonal shape overlapping a virtual elliptical shape. A distance between end portions of the second area AR2 spaced apart from each other in the first direction (for example, the x direction or the −x direction) may be different from a distance between end portions of the second area AR2 spaced apart from each other in the second direction (for example, the y direction or the −y direction). A third direction (for example, the z direction or the −z direction) may be a thickness direction and may be substantially perpendicular to the x direction and the y direction. As an example, a distance between end portions of the second area AR2 spaced apart from each other in the first direction (for example, the x direction or the −x direction) may be greater than a distance between end portions of the second area AR2 spaced apart from each other in the second direction (for example, the y direction or the −y direction).

The second pixel PX2 may be arranged in the second area AR2. In an embodiment, second pixels PX2 may be arranged in the second area AR2. Accordingly, the display apparatus 1 may display images in the second area AR2.

Though it is shown in FIGS. 1A and 1B that the first area AR1 and the second area AR2 are arranged on the upper side of the display apparatus 1, the first area AR1 and the second area AR2 may be arranged in the lower side, the right, or the left of the display apparatus 1 in an embodiment.

The third region AR3 may surround at least a portion of the second region AR2. In an embodiment, the third area AR3 may surround at least a portion of the first area AR1 and the second area AR2. As an example, the third area AR3 may surround only a portion of the first area AR1 and the second area AR2. As another example, the third area AR3 may surround the first area AR1 and the second area AR2 entirely. In an embodiment, the resolution of the third area AR3 of the display apparatus 1 may be equal to or greater than the resolution of the first area AR1 of the display apparatus 1. In an embodiment, the resolution of the third area AR3 of the display apparatus 1 may be equal to or greater than the resolution of the second area AR2 of the display apparatus 1.

The fourth region AR4 may surround at least a portion of the first region AR1. In an embodiment, the fourth region AR4 may surround the first region AR1 entirely. In an embodiment, the fourth region AR4 may surround the first region AR1, the second region AR2, and the third region AR3 entirely.

Figure 2:
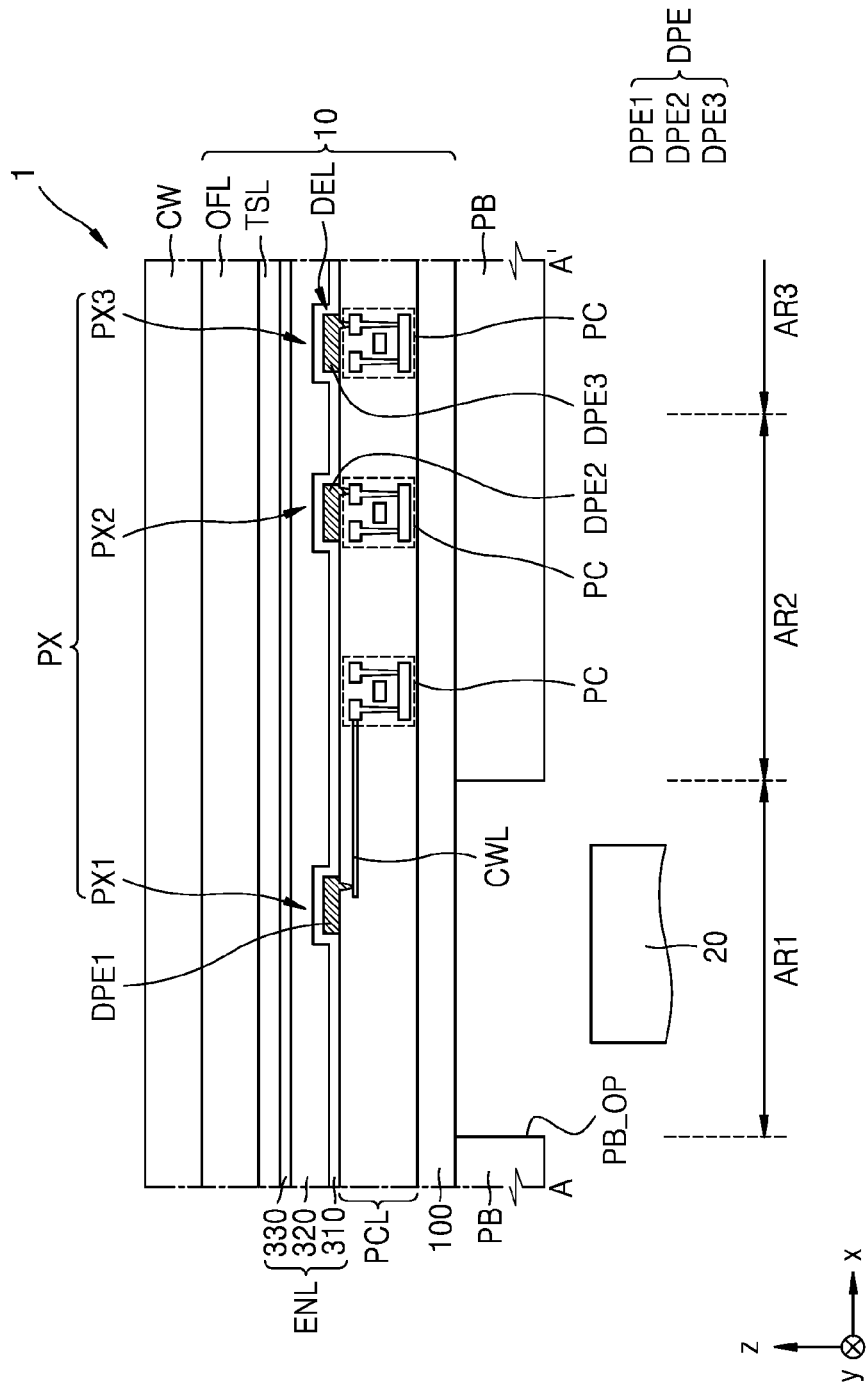
FIG. 2 is a schematic cross-sectional view of the display apparatus, taken along line A-A' of FIG. 1A.

FIG. 2 is a schematic cross-sectional view of the display apparatus 1, taken along line A-A' of FIG. 1A.

Referring to FIG. 2, the display apparatus 1 may include a display panel 10, a panel-protecting member PB, a component 20, and a cover window CW. The display panel 10 may include a substrate 100, a pixel circuit layer PCL, a display element layer DEL, an encapsulation layer ENL, a touch sensor layer TSL, and an optical functional layer OFL, the pixel circuit layer PCL including a pixel circuit PC, and the display element layer DEL including a display element DPE.

The display apparatus 1 may include the first region AR1, the second region AR2, and the third region AR3. In other words, the first region AR1, the second region AR2, and the third region AR3 may be defined in the substrate 100 and a multi-layer on the substrate 100. As an example, the first region AR1, the second region AR2, and the third region AR3 may be defined in the substrate 100. For example, the substrate 100 may include the first region AR1, the second region AR2, and the third region AR3. Hereinafter, the case where the substrate 100 may include the first region AR1, the second region AR2, and the third region AR3 is described in detail.

The substrate 100 may include an insulating material such as glass, quartz, a polymer resin or the like within the spirit and the scope of the disclosure. The substrate 100 may be a rigid substrate or a flexible substrate that is bendable, foldable, and rollable.

Figure 8:
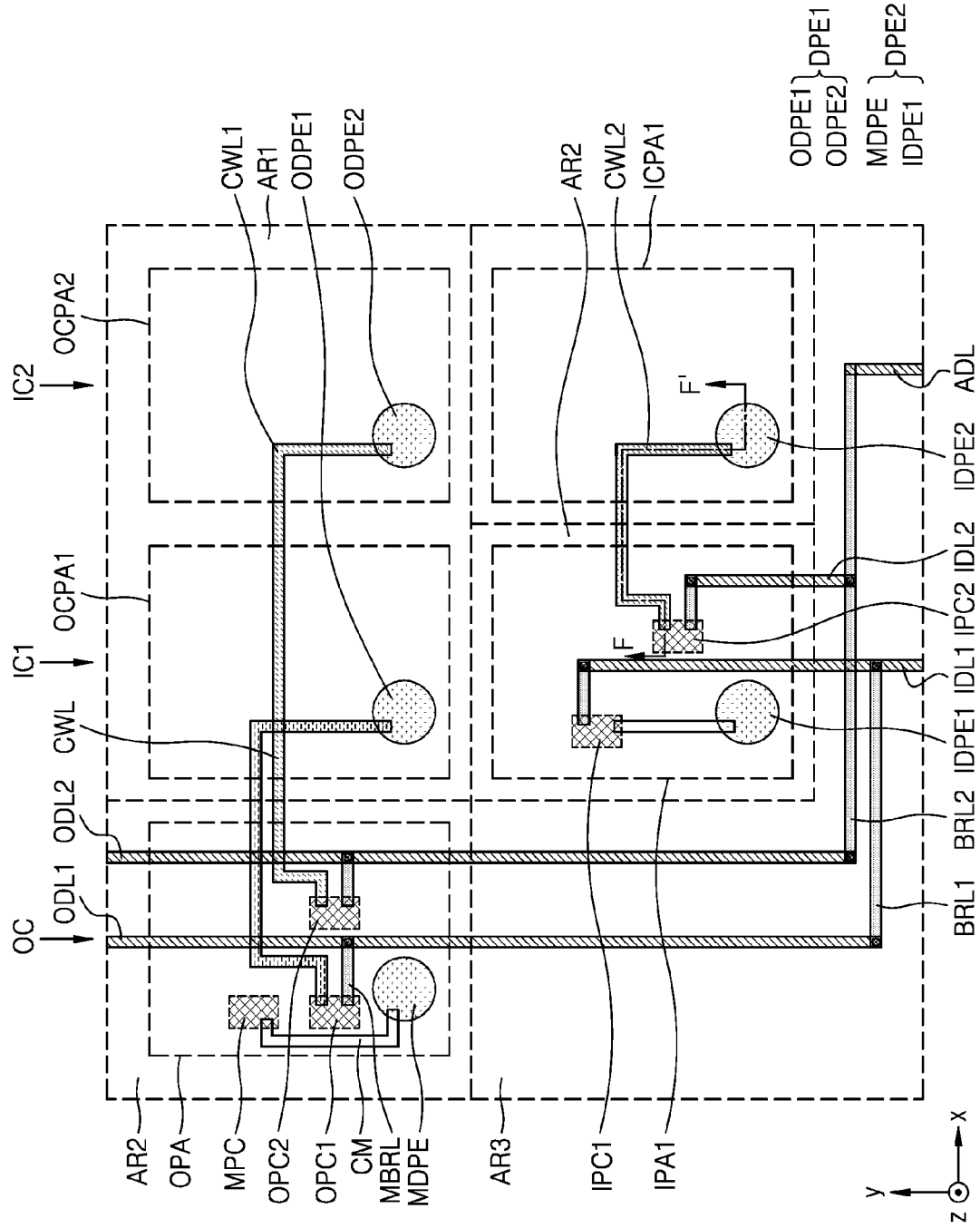
FIG. 8 is an enlarged view of an outer pixel area, a first outer corresponding pixel area, a second outer corresponding pixel area, a first inner pixel area, and a first inner corresponding pixel area of FIG. 7 according to an embodiment.
Figure 11:
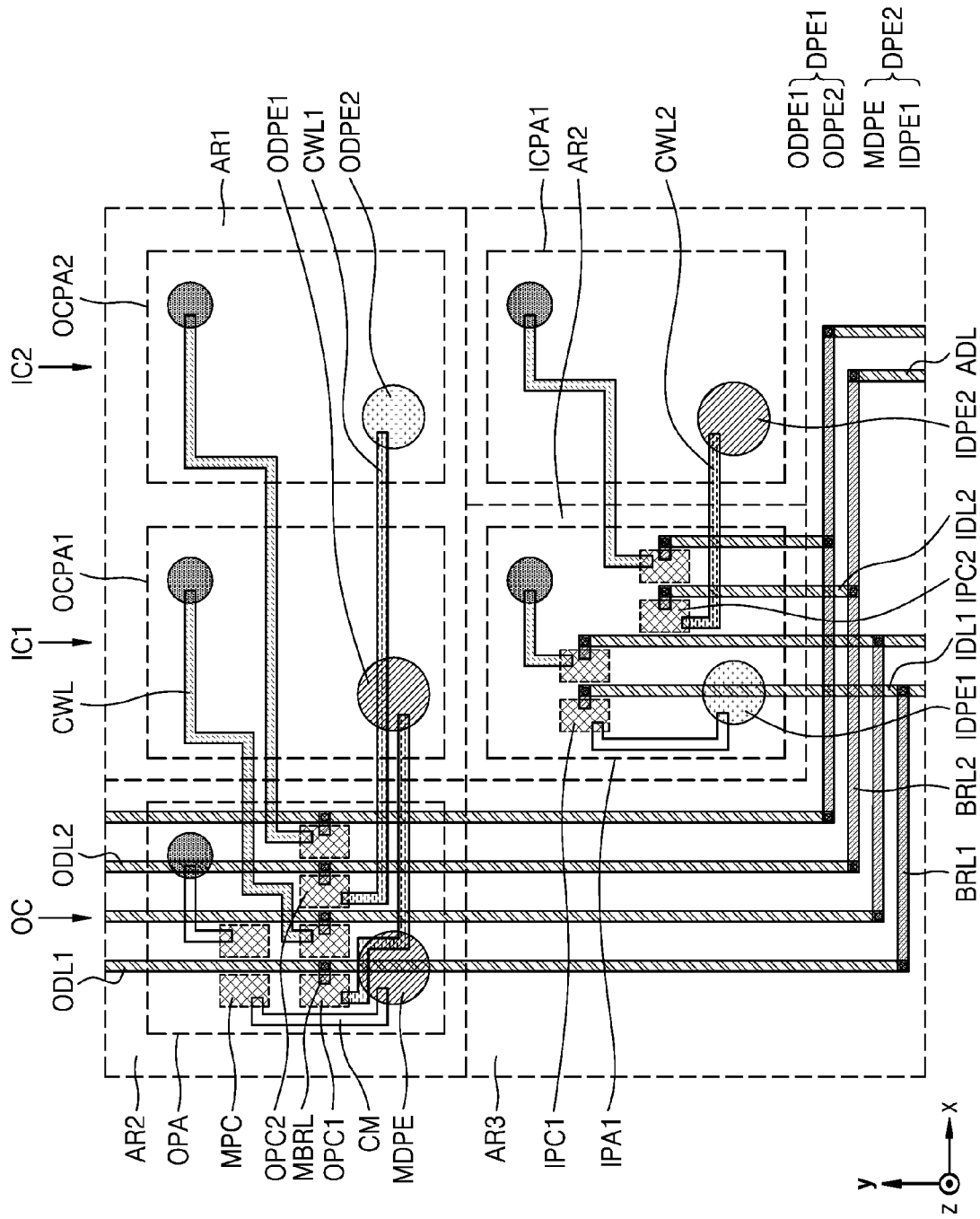
FIG. 11 is an enlarged view of an outer pixel area, a first outer corresponding pixel area, a second outer corresponding pixel area, a first inner pixel area, and a first inner corresponding pixel area of FIG. 7 according to an embodiment.

The pixel circuit layer PCL may be arranged on the substrate 100. The pixel circuit layer PCL may include the pixel circuit PC, a connection line CWL, and an insulating layer. The connection line CWL may include a first connection line CWL1 and a second connection line CWL2 as shown in FIGS. 8 and 11. The pixel circuit PC may include at least one thin-film transistor. The pixel circuit PC may be provided in plural. The pixel circuits PC may be arranged in at least one of the second area AR2 and the third area AR3. The pixel circuit PC may not be arranged in the first area AR1. Accordingly, a transmittance (for example, a light transmittance) of the first area AR1 of the display panel 10 may be greater than a transmittance (for example, a light transmittance) of the second area AR2 and the third area AR3.

The connection line CWL may be electrically connected to the pixel circuit PC. In an embodiment, the connection line CWL may be electrically connected to the pixel circuit PC arranged in the second area AR2. In an embodiment, the connection line CWL may include a transparent conductive oxide. As an example, the connection line CWL may include a conductive oxide such as indium tin oxide (ITO), indium zinc oxide (IZO), ZnO, indium oxide ($In_2O_3$), indium gallium oxide (IGO), and/or aluminum zinc oxide (AZO).

The display element layer DEL may include the display element DPE and be arranged on the pixel circuit layer PCL. In an embodiment, the display element DPE may implement the pixel PX by emitting light. In an embodiment, the display element DPE may be an organic light-emitting diode including an organic emission layer. By way of example, the display element DPE may be a light-emitting diode LED. The size of the light-emitting diode LED may be microscale or nanoscale. As an example, the light-emitting diode may be a micro light-emitting diode. By way of example, the light-emitting diode may be a nanorod light-emitting diode. The nanorod light-emitting diode may include gallium nitride (GaN). In an embodiment, a color-converting layer may be arranged on the nanorod light-emitting diode. The color-converting layer may include quantum dots. By way of example, the display element DPE may be a quantum-dot light-emitting diode including a quantum-dot emission layer. By way of example, the display element DPE may be an inorganic light-emitting diode including an inorganic semiconductor. Hereinafter, the case where the display element DPE may include an organic light-emitting diode is described in detail.

The display element DPE may be provided in plural. The display elements DPE may be arranged in the first region AR1, the second region AR2, and the third region AR3. The display elements DPE may include a first display element DPE1 arranged in the first area AR1, a second display element DPE2 arranged in the second area AR2, and a third display element DPE3 arranged in the third area AR3. The first display element DPE1 may implement the first pixel PX1 by emitting light. The second display element DPE2 may implement the second pixel PX2 by emitting light. The third display element DPE3 may implement the third pixel PX3 by emitting light. Accordingly, the display apparatus 1 may display images in the first region AR1, the second region AR2, and the third region AR3.

The display element DPE may be electrically connected to the pixel circuit PC. The first display element DPE1 may be electrically connected to a pixel circuit PC arranged in the second area AR2. In an embodiment, the first display element DPE1 may be electrically connected to the pixel circuit PC arranged in the second area AR2 through the connection line CWL. The second display element DPE2 may be electrically connected to the pixel circuit PC arranged in the second area AR2. The third display element DPE3 may be electrically connected to a pixel circuit PC arranged in the third area AR3.

The encapsulation layer ENL may be arranged on the display element layer DEL. The encapsulation layer ENL may cover or overlap the display element DPE. In an embodiment, the encapsulation layer ENL may include at least one inorganic encapsulation layer and at least one organic encapsulation layer. The at least one inorganic encapsulation layer may include at least one inorganic material among aluminum oxide ($Al_2O_3$), titanium oxide ($TiO_2$), tantalum oxide ($Ta_2O_5$), zinc oxide ($ZnO_x$), silicon oxide ($SiO_2$), silicon nitride ($SiN_x$), and silicon oxynitride (SiON). Zinc oxide ($ZnO_x$) may be ZnO and $ZnO_2$. At least one organic encapsulation layer may include a polymer-based material. The polymer-based material may include an acryl-based resin, an epoxy-based resin, polyimide, and polyethylene. In an embodiment, the at least one organic encapsulation layer may include acrylate.

In an embodiment, the encapsulation layer ENL may include a first inorganic encapsulation layer 310, an organic encapsulation layer 320, and a second inorganic encapsulation layer 330 that may be sequentially stacked each other. The first inorganic encapsulation layer 310 and the second inorganic encapsulation layer 330 may prevent or reduce the organic encapsulation layer 320 and/or the display element DPE from being exposed to foreign materials such as moisture and the like within the spirit and the scope of the disclosure.

In an embodiment, the encapsulation layer ENL may have a structure in which the substrate 100 is coupled or connected to an upper substrate, which is a transparent member, by using an encapsulation member, and thus, an inner space between the substrate 100 and the upper substrate is sealed. A moisture absorber, a filler or the like may be arranged in the inner space. The encapsulation member may be sealant. In an embodiment, the encapsulation member may include a material hardened by a laser beam. As an example, the encapsulation member may include frit. By way of non-limiting example, the encapsulation member may include an organic sealant such as a urethane-based resin, an epoxy-based resin, and an acrylic resin, or an inorganic sealant. In an embodiment, the encapsulation member may include silicone. For a urethane-based rein, for example, urethane acrylate and the like may be used. For an acryl-based resin, for example, butyl acrylate, ethylhexyl acrylate, and the like may be used. The encapsulation member may include a material hardened by heat.

The touch sensor layer TSL may obtain coordinate information corresponding to an external input, for example, a touch event. The touch sensor layer TSL may include a touch electrode and touch wirings connected to the touch electrode. The touch sensor layer TSL may sense an external input by using a self-capacitance method or a mutual capacitance method.

The touch sensor layer TSL may be arranged on the encapsulation layer ENL. In an embodiment, the touch sensor layer TSL may be formed on or directly formed on the encapsulation layer ENL. An adhesive layer such as an optically clear adhesive may not be arranged between the touch sensor layer TSL and the encapsulation layer ENL. In an embodiment, the touch sensor layer TSL may be separately formed on a touch substrate and coupled or connected to the encapsulation layer ENL through an adhesive layer such as an optically clear adhesive.

The optical functional layer OFL may include an anti-reflection layer. The anti-reflection layer may reduce reflectivity of light (for example, external light) incident toward the display apparatus 1 from outside. In an embodiment, the optical functional layer OFL may be a polarizing film. In an embodiment, the optical functional layer OFL may be a filter plate including a black matrix and color filters.

The cover window CW may be arranged on the display panel 10. The cover window CW may protect the display panel 10. The cover window CW may include at least one of glass, sapphire, and plastic. The cover window CW may include, for example, ultra-thin glass, or colorless polyimide.

The panel-protecting member PB may be arranged under or below the substrate 100. The panel-protecting member PB may support and protect the substrate 100. In an embodiment, the panel-protecting member PB may include an opening PB_OP overlapping the first area AR1. In an embodiment, the opening PB_OP of the panel-protecting member PB may overlap the first area AR1 and the second area AR2. In an embodiment, the panel-protecting member PB may include polyethylene terephthalate or polyimide.

The component 20 may be arranged below the display panel 10. In an embodiment, the display panel 10 may be arranged between the cover window CW and the component 20. In an embodiment, the component 20 may overlap the first area AR1. Accordingly, in an embodiment, the first area AR1 may be a component area. The second area AR2 may be an adjacent area that neighbors the component area.

The component 20 is a camera that uses an infrared ray, visible light or the like and may have a photographing element. By way of example, the component 20 may be a solar battery, a flash, an illuminance sensor, a proximity sensor, or an iris sensor. By way of example, the component 20 may have a function of receiving sounds. To reduce the limitation of the functionality of the component 20, the pixel circuit PC that drives the first display element DPE1 may not be arranged in the first area AR1 but may be arranged in the second area AR2. Accordingly, a transmittance of in the first area AR1 of the display panel 10 may be greater than a transmittance of the second area AR2 of the display panel 10. Accordingly, a transmittance of in the first area AR1 of the display panel 10 may be greater than a transmittance of the third area AR3 of the display panel 10.

Figure 3:
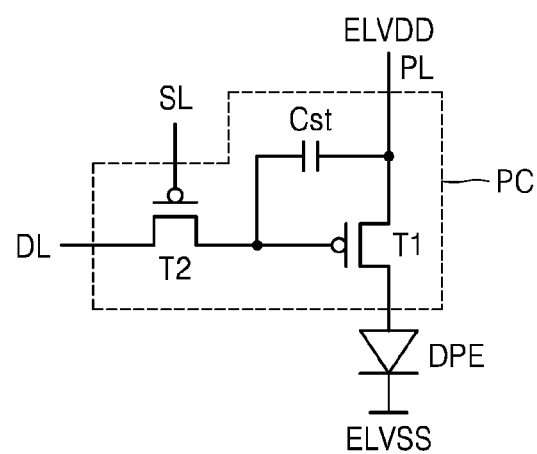
FIG. 3 is a schematic diagram of an equivalent circuit of a pixel circuit electrically connected to a display element according to an embodiment.

FIG. 3 is a schematic diagram of an equivalent circuit of a pixel circuit PC electrically connected to a display element DPE according to an embodiment.

Referring to FIG. 3, the pixel circuit PC may include a driving thin-film transistor T1, a switching thin-film transistor T2, and a storage capacitor Cst.

The switching thin-film transistor T2 is electrically connected to a scan line SL and a data line DL, and may transfer a data voltage or a data signal to the driving thin-film transistor T1 according to a switching voltage or a switching signal input from the scan line SL, the data voltage or the data signal being input from the data line DL. The storage capacitor Cst may be electrically connected to the switching thin-film transistor T2 and a driving voltage line PL and may store a voltage corresponding to a difference between a voltage transferred from the switching thin-film transistor T2 and a driving voltage ELVDD supplied to the driving voltage line PL.

The driving thin-film transistor T1 may be electrically connected to the driving voltage line PL and the storage capacitor Cst and may control a driving current according to the voltage stored in the storage capacitor Cst, the driving current flowing from the driving voltage line PL to the display element DPE. The display element DPE may emit light having a preset brightness based on the driving current. An opposite electrode of the display element DPE may receive a common voltage ELVSS.

Though it is shown in FIG. 3 that the pixel circuit PC may include two thin-film transistors and one storage capacitor, the pixel circuit PC may include three or more thin-film transistors.

Figure 4A:
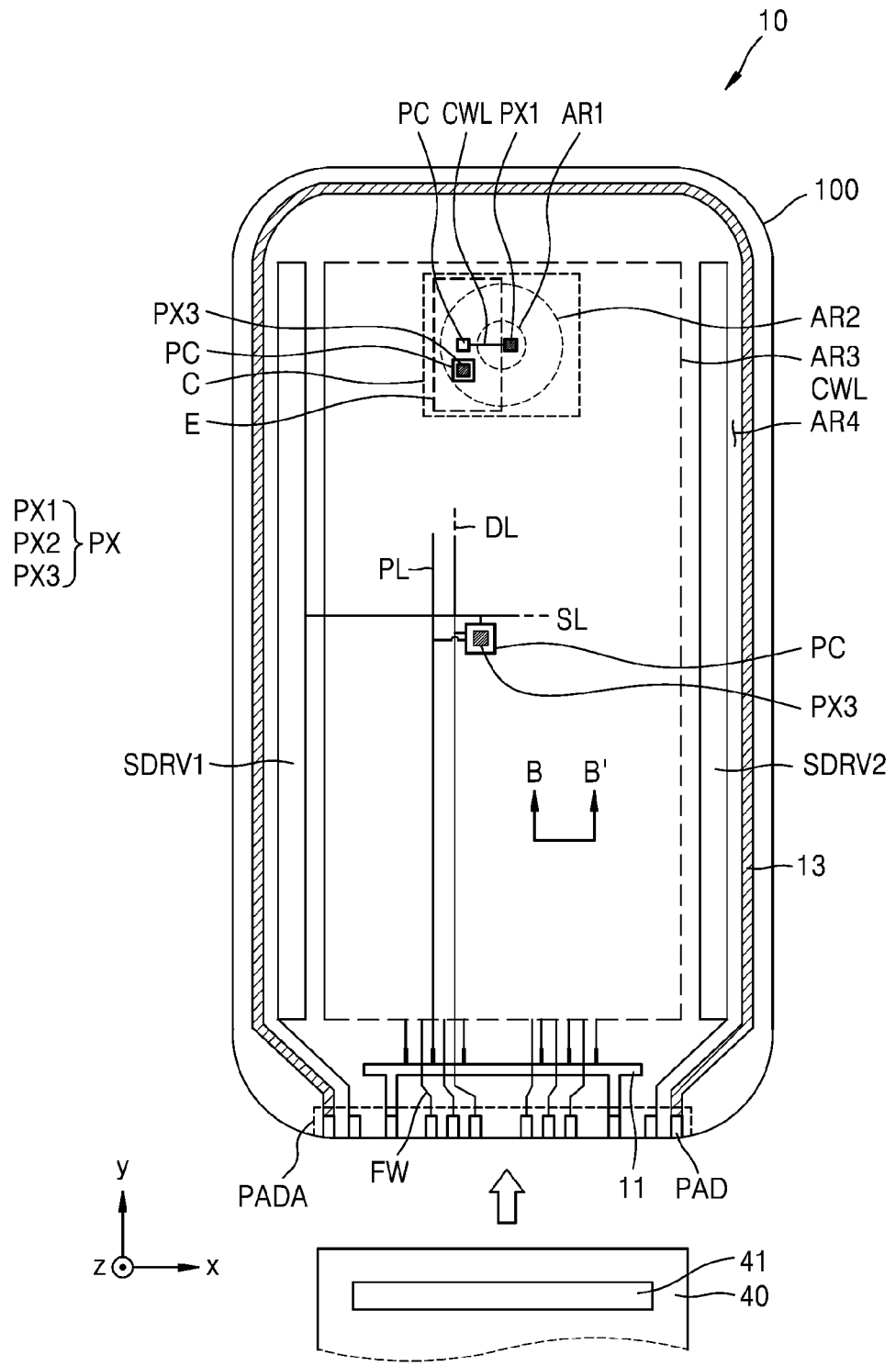
FIGS. 4A and 4B are schematic plan views of a display panel according to an embodiment.
Figure 4B:
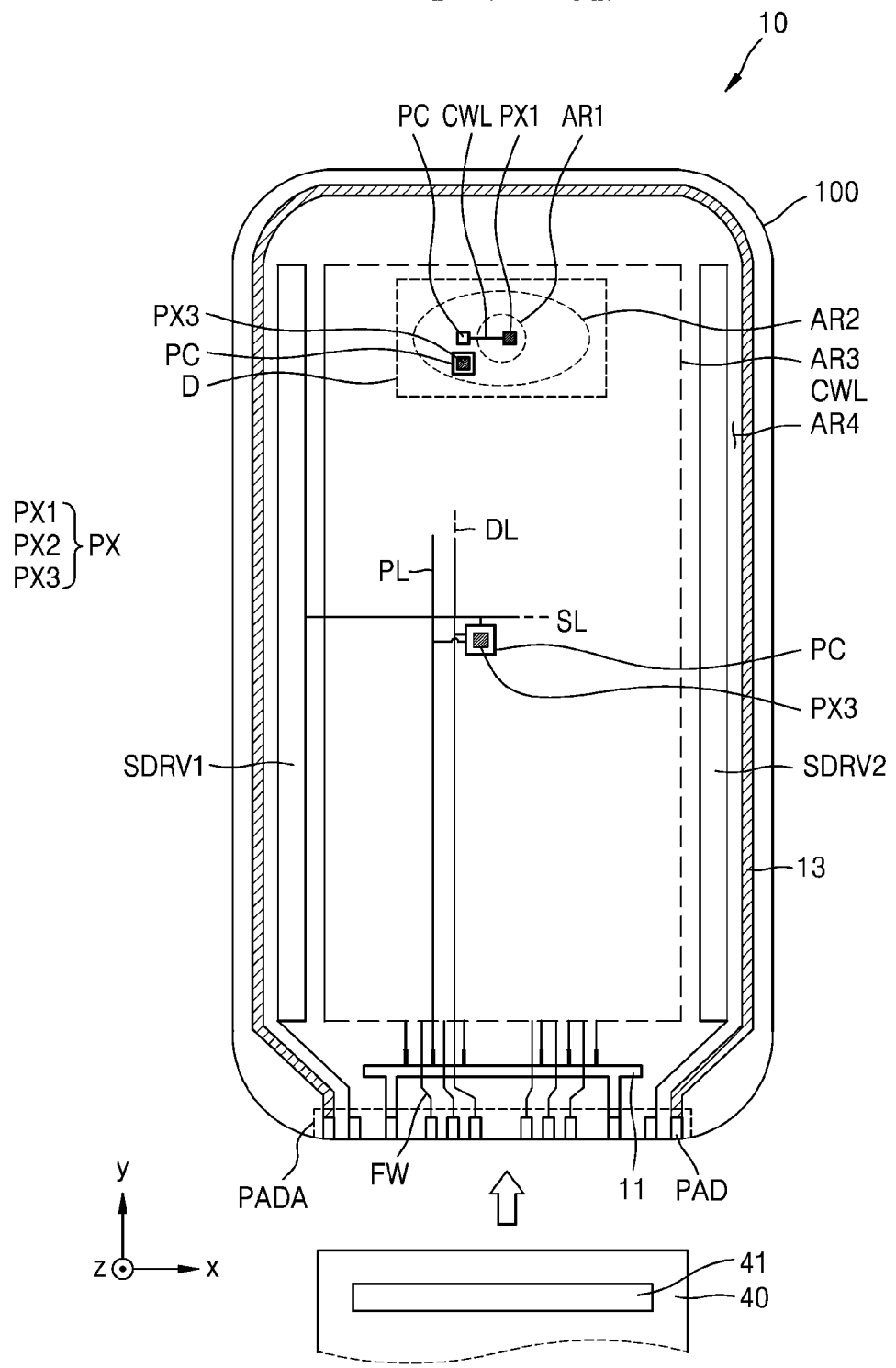

FIGS. 4A and 4B are schematic plan views of the display panel 10 according to an embodiment. In FIGS. 4A and 4B, the same reference numerals as those of FIGS. 1A and 1B denote the same members, and thus, repeated descriptions thereof are omitted.

Referring to FIGS. 4A and 4B, the display panel 10 may include the substrate 100, the pixel circuit PC, and the pixels PX. In an embodiment, the substrate 100 may include the first area AR1, the second area AR2, the third area AR3, and the fourth area AR4. The second region AR2 may surround at least a portion of the first region AR1. Referring to FIG. 4A, the outer periphery of the second area AR2 may have a substantially circular shape. In an embodiment, the outer periphery of the second area AR2 may have a polygonal shape overlapping a virtual circular shape. Referring to FIG. 4B, the outer periphery of the second area AR2 may have a substantially elliptical shape. In an embodiment, the outer periphery of the second area AR2 may have a polygonal shape overlapping a virtual elliptical shape. In an embodiment, a distance between end portions of the second area AR2 spaced apart from each other in the first direction (for example, the x direction or the −x direction) may be different from a distance between end portions of the second area AR2 spaced apart from each other in the second direction (for example, the y direction or the −y direction). As an example, a distance between end portions of the second area AR2 spaced apart from each other in the first direction (for example, the x direction or the −x direction) may be greater than a distance between end portions of the second area AR2 spaced apart from each other in the second direction (for example, the y direction or the −y direction).

Referring to FIGS. 4A and 4B again, the third area AR3 may overlap at least a portion of the second area AR2. The third area AR3 may surround at least a portion of the first area AR1 and the second area AR2. The fourth region AR4 may surround at least a portion of the third region AR3. The fourth region AR4 may surround at least a portion of the first region AR1, the second region AR2, and the third region AR3.

The pixel circuit PC may not be arranged in the first area AR1. The pixel circuit PC may be arranged in the second area AR2 and/or the third area AR3. In an embodiment, the pixel circuit PC may be arranged in the fourth area AR4. The pixel circuit PC may be provided in plural. The pixel circuits PC may be arranged in the second area AR2 and the third area AR3. Accordingly, a sound or light transmittance of in the first area AR1 of the display panel 10 may be greater than a sound or light transmittance of the second area AR2 of the display panel 10. A sound or light transmittance of in the first area AR1 of the display panel 10 may be greater than a sound or light transmittance of the third area AR3 of the display panel 10.

The pixel PX may be implemented by the display element such as an organic light-emitting diode. The pixels PX may include the first pixel PX1, the second pixel PX2, and the third pixel PX3. The first pixel PX1 may be electrically connected to a pixel circuit PC arranged in the second area AR2. In an embodiment, the first pixel PX1 may be electrically connected to the pixel circuit PC arranged in the second area AR2 through the connection line CWL. The second pixel PX2 may be electrically connected to a pixel circuit PC arranged in the second area AR2. The second pixel PX2 may be adjacent to or may overlap the pixel circuit PC arranged in the second area AR2. The third pixel PX3 may be electrically connected to a pixel circuit PC arranged in the third area AR3. In an embodiment, the third pixel PX3 may be adjacent to or may overlap the pixel circuit PC arranged in the third area AR3.

The pixel PX may be provided in plural, and the pixels PX may display images by emitting light. In an embodiment, each of the first pixel PX1, the second pixel PX2, and the third pixel PX3 may be provided in plural. The first pixels PX1, the second pixels PX2, and the third pixels PX3 may display one image or respectively display independent images.

In an embodiment, the resolutions of the first area AR1 and the second area AR2 of the display panel 10 may be equal to or less than the resolution of the third area AR3 of the display panel 10. As an example, the resolutions of the first area AR1 and the second area AR2 of the display panel 10 may be about 1/1, 1/2, 3/8, 1/3, 1/4, 2/9, 1/8, 1/9, 1/16 or the like of the resolution of the third area AR3 of the display panel 10.

The fourth area AR4 may be the non-display area in which the pixels PX are not arranged. In an embodiment, the display panel 10 may further include a first scan driving circuit SDRV1, a second scan driving circuit SDRV2, a pad PAD, a driving voltage supply line 11, and a common voltage supply line 13 arranged in the fourth area AR4.

One of the first scan driving circuit SDRV1 and the second scan driving circuit SDRV2 may apply scan signals to the pixel circuit PC through the scan line SL. In an embodiment, the third area AR3 may be arranged between the first scan driving circuit SDRV1 and the second scan driving circuit SDRV2. In an embodiment, one of the pixels PX may receive a scan signal from the first scan driving circuit SDRV1, and another of the pixels PX may receive a scan signal from the second scan driving circuit SDRV2.

The pad PAD may be arranged in a pad area PADA on one side or a side of the fourth area AR4. The pad PAD may be exposed and electrically connected to a display circuit board 40 by not being covered or overlapped by an insulating layer. A display driver 41 may be arranged on the display circuit board 40.

The display driver 41 may generate signals transferred to the first scan driving circuit SDRV1 and the second scan driving circuit SDRV2. The display driver 41 may generate data signals, and the generated data signals may be transferred to the pixel circuit PC through a fan-out wiring FW and the data line DL connected to the fan-out wiring FW.

The display driver 41 may supply the driving voltage ELVDD (see FIG. 3) to the driving voltage supply line 11 and supply the common voltage ELVSS (see FIG. 3) to the common voltage supply line 13. The driving voltage ELVDD may be supplied to the pixel circuit PC through the driving voltage line PL electrically connected to the driving voltage supply line 11, and the common voltage ELVSS may be supplied to an opposite electrode of the display element electrically connected to the common voltage supply line 13.

Figure 5:
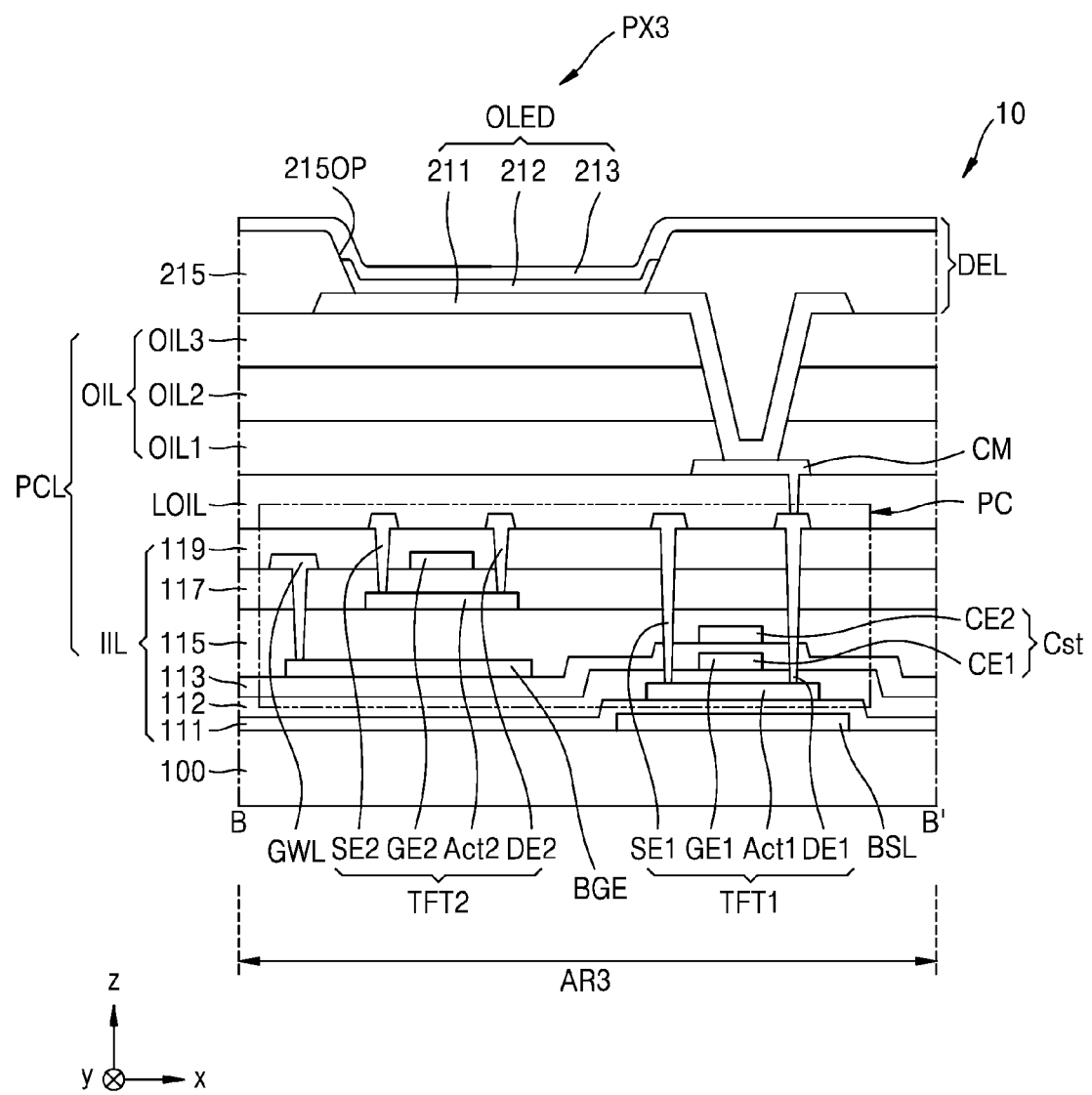
FIG. 5 is a schematic cross-sectional view of the display panel, taken along line B-B' of FIG. 4A.

FIG. 5 is a schematic cross-sectional view of the display panel 10, taken along line B-B' of FIG. 4A.

Referring to FIG. 5, the display panel 10 may include the substrate 100, the pixel circuit layer PCL, and the display element layer DEL. In an embodiment, the substrate 100 may include the third area AR3. The substrate 100 may include glass or a polymer resin such as polyethersulfone, polyarylate, polyetherimide, polyethylene naphthalate, polyethylene terephthalate, polyphenylene sulfide, polyimide, polycarbonate, cellulose tri acetate, cellulose acetate propionate, and the like within the spirit and the scope of the disclosure. In an embodiment, the substrate 100 may have a multi-layered structure including a base layer and a barrier layer (not shown) each including the polymer resin. The substrate 100 including the polymer resin is flexible, rollable, and bendable.

The pixel circuit layer PCL may be arranged on the substrate 100. The pixel circuit layer PCL may include the pixel circuit PC, an inorganic insulating layer IIL, a lower organic insulating layer LOIL, an organic insulating layer OIL, and a connection electrode CM. In an embodiment, the inorganic insulating layer IIL may include a buffer layer 111, a first gate insulating layer 112, a second gate insulating layer 113, a first insulating layer 115, a second insulating layer 117, and an interlayer insulating layer 119. In an embodiment, the organic insulating layer OIL may include a first organic insulating layer OIL1, a second organic insulating layer OIL2, and a third organic insulating layer OIL3 that may be sequentially stacked each other.

The pixel circuit PC may be arranged in the third area AR3. The pixel circuit PC may include the first thin-film transistor T1, the second thin-film transistor T2, and the storage capacitor Cst. The first thin-film transistor TFT1 may include a first semiconductor layer Act1, a first gate electrode GE1, a first source electrode SE1, and a first drain electrode DE1. The second thin-film transistor TFT2 may include a second semiconductor layer Act2, a second gate electrode GE2, a second source electrode SE2, and a second drain electrode DE2. The storage capacitor Cst may include a lower electrode CE1 and an upper electrode CE2.

The buffer layer 111 may be arranged on the substrate 100. The buffer layer 111 may include an inorganic insulating material such as silicon nitride ($SiN_x$), silicon oxynitride (SiON), and silicon oxide ($SiO_2$), and include a single layer or a multi-layer including the inorganic insulating materials.

The first semiconductor layer Act1 may include a silicon semiconductor. The first semiconductor layer Act1 may include polycrystalline silicon. By way of example, the first semiconductor layer Act1 may include amorphous silicon. In an embodiment, the first semiconductor layer Act1 may include an oxide semiconductor, an organic semiconductor or the like within the spirit and the scope of the disclosure. The first semiconductor layer Act1 may include a channel region, a drain region, and a source region, the drain region and the source region being on two opposite sides of the channel region. The first gate electrode GE1 may overlap the channel region.

The first gate electrode GE1 may overlap the first semiconductor layer Act1. The first gate electrode GE1 may include a low-resistance metal material. The first gate electrode GE1 may include a conductive material including molybdenum (Mo), aluminum (Al), copper (Cu), and titanium (Ti) and have a single-layered structure or a multi-layered structure including the above materials.

The first gate insulating layer 112 may be arranged between the first semiconductor layer Act1 and the first gate electrode GE1. Accordingly, the first semiconductor layer Act1 may be insulated from the first gate electrode GE1. The first gate insulating layer 112 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_x$). In an embodiment, zinc oxide ($ZnO_x$) may be ZnO and/or $ZnO_2$.

The second gate insulating layer 113 may cover or overlap the first gate electrode GE1. The second gate insulating layer 113 may be arranged on the first gate electrode GE1. Similar to the first gate insulating layer 112, the second gate insulating layer 113 may include an inorganic insulating material including silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_x$).

The upper electrode CE2 may be arranged on the second gate insulating layer 113. The upper gate electrode CE2 may overlap the first gate electrode GE1 therebelow. The upper electrode CE2 may overlap the first gate electrode GE1 with the second gate insulating layer 113 therebetween to constitute the storage capacitor Cst. For example, the first gate electrode GE1 of the first thin-film transistor TFT1 may serve as the lower electrode CE1 of the storage capacitor Cst. As described above, the storage capacitor Cst may overlap the first thin-film transistor TFT1. In an embodiment, the storage capacitor Cst may not overlap the first thin-film transistor TFT1. The upper electrode CE2 may include aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and/or copper (Cu), and include a single layer or a multi-layer including the above materials.

The first inorganic insulating layer 115 may cover or overlap the upper electrode CE2. In an embodiment, the first inorganic insulating layer 115 may cover or overlap the first gate electrode GE1. The first inorganic insulating layer 115 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$). The first inorganic insulating layer 115 may include a single layer or a multi-layer including the inorganic insulating material.

The second semiconductor layer Act2 may be arranged on the first inorganic insulating layer 115. In an embodiment, the second semiconductor layer Act2 may include a channel region, a drain region, and a source region, the drain region and the source region being on two opposite sides of the channel region. The second semiconductor layer Act2 may include an oxide semiconductor. As an example, the second semiconductor layer Act2 may include Zn-oxide-based material and include Zn-oxide, In—Zn oxide, and Ga—In—Zn oxide. By way of example, the second semiconductor layer Act2 may include In—Ga—Zn—O (IGZO), In—Sn—Zn—O (ITZO), or In—Ga—Sn—Zn—O (IGTZO) semiconductor containing metal such as indium (In), gallium (Ga), and stannum (Sn) in ZnO.

The source region and the drain region of the second semiconductor layer Act2 may be made conductive by adjusting the carrier concentration of an oxide semiconductor. As an example, the source region and the drain region of the second semiconductor layer Act2 may be formed by increasing the carrier concentration through plasma treatment that uses a hydrogen-based gas, a fluorine-based gas, or a combination thereof on the oxide semiconductor.

The second inorganic insulating layer 117 may cover or overlap the second semiconductor layer Act2. The second inorganic insulating layer 117 may be arranged between the second semiconductor layer Act2 and the second gate electrode GE2. In an embodiment, the second inorganic insulating layer 117 may be arranged over the substrate 100 entirely. In an embodiment, the second inorganic insulating layer 117 may be patterned along the shape of the second gate electrode GE2. The second inorganic insulating layer 117 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$). The second inorganic insulating layer 117 may include a single layer or a multi-layer including the inorganic insulating material.

The second gate electrode GE2 may be arranged on the second inorganic insulating layer 117. The second gate electrode GE2 may overlap the second semiconductor layer Act2. The second gate electrode GE2 may overlap the channel region of the second semiconductor layer Act2. The second gate electrode GE2 may include a conductive material including molybdenum (Mo), aluminum (Al), copper (Cu), and titanium (Ti) and have a single-layered structure or a multi-layered structure including the above materials.

An interlayer insulating layer 119 may cover or overlap the second gate electrode GE2. The interlayer insulating layer 119 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$). The interlayer insulating layer 119 may include a single layer or a multi-layer including the inorganic insulating material.

The first source electrode SE1 and the first drain electrode DE1 may be arranged on the interlayer insulating layer 119. The first source electrode SE1 and the first drain electrode DE1 may be electrically connected to the first semiconductor layer Act1. The first source electrode SE1 and the first drain electrode DE1 may be electrically connected to the first semiconductor layer Act1 through contact holes of the insulating layers.

The second source electrode SE2 and the second drain electrode DE2 may be arranged on the interlayer insulating layer 119. The second source electrode SE2 and the second drain electrode DE2 may be electrically connected to the second semiconductor layer Act2. The second source electrode SE2 and the second drain electrode DE2 may be electrically connected to the second semiconductor layer Act2 through contact holes of the insulating layers.

The first source electrode SE1, the first drain electrode DE1, the second source electrode SE2, and the second drain electrode DE2 may each include a material having a high conductivity. The first source electrode SE1, the first drain electrode DE1, the second source electrode SE2, and the second drain electrode DE2 may each include a conductive material including molybdenum (Mo), aluminum (Al), copper (Cu), titanium (Ti), and the like, and include a multi-layer or a single layer including the above materials. In an embodiment, the first source electrode SE1, the first drain electrode DE1, the second source electrode SE2, and the second drain electrode DE2 may each have a multi-layered structure of Ti/Al/Ti.

The first thin-film transistor TFT1 including the first semiconductor layer Act1 including a silicon semiconductor may have a high reliability. Accordingly, in case that the first thin-film transistor TFT1 is employed as a driving thin-film transistor, the display panel 10 of a high-quality may be implemented.

Because an oxide semiconductor has high carrier mobility and a low leakage current, a voltage drop may not be large even in case that a driving time is long. For example, because a color change of an image due to a voltage drop is not large even in case that a display apparatus is driven at low frequencies, the display apparatus may be driven at low frequencies. As described above, because an oxide semiconductor has an advantage of a low leakage current, in case that an oxide semiconductor may be employed for at least one of other thin-film transistors except the driving thin-film transistor, a leakage current may be prevented, and simultaneously, power consumption may be reduced. As an example, the second thin-film transistor TFT2 may be employed as a switching thin-film transistor.

A bottom gate electrode BGE may be arranged below the second semiconductor layer Act2. In an embodiment, the bottom gate electrode BGE may be arranged between the second gate insulating layer 113 and the first inorganic insulating layer 115. In an embodiment, the bottom gate electrode BGE may receive gate signals. The second thin-film transistor TFT2 may have a double gate electrode structure in which gate electrodes are respectively arranged over and below the second semiconductor layer Act2.

In an embodiment, a gate line GWL may be arranged between the second inorganic insulating layer 117 and the interlayer insulating layer 119. In an embodiment, the gate line GWL may be electrically connected to the bottom gate electrode BGE through a contact hole provided in the first inorganic insulating layer 115 and the second inorganic insulating layer 117.

In an embodiment, a bottom shield layer BSL may be arranged between the substrate 100 and the pixel circuit PC. In an embodiment, the bottom shield layer BSL may overlap the first thin-film transistor TFT1. A constant voltage may be applied to the bottom shield layer BSL. Because the bottom shield layer BSL is arranged below the first thin-film transistor TFT1, the first thin-film transistor TFT1 is less influenced by ambient interference signals, and thus, reliability may be improved.

The bottom shield layer BSL may include a transparent conductive material. In an embodiment, the bottom shield layer BSL may include a transparent conductive oxide. As an example, the bottom shield layer BSL may include a conductive oxide such as indium tin oxide (ITO), indium zinc oxide (IZO), ZnO, indium oxide ($In_2O_3$), indium gallium oxide (IGO), or aluminum zinc oxide (AZO).

The lower organic insulating layer LOIL may cover or overlap the first source electrode SE1, the first drain electrode DE1, the second source electrode SE2, and the second drain electrode DE2. The lower organic insulating layer LOIL may include an organic material. As an example, the lower organic insulating layer LOIL may include an organic insulating material including a general-purpose polymer such as polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof.

The connection electrode CM may be arranged on the lower organic insulating layer LOIL. The connection electrode CM may be electrically connected to the first drain electrode DE1 or the first source electrode SE1 through a contact hole of the lower organic insulating layer LOIL. The connection electrode CM may include a material having high conductivity. The connection electrode CM may include a conductive material including molybdenum (Mo), aluminum (Al), copper (Cu), and titanium (Ti) and have a single-layered structure or a multi-layered structure including the above materials. In an embodiment, the connection electrode CM may have a multi-layered structure of Ti/Al/Ti.

The first organic insulating layer OIL1, the second organic insulating layer OIL2, and the third organic insulating layer OIL3 may cover or overlap the connection electrode CM. The first organic insulating layer OIL1, the second organic insulating layer OIL2, and the third organic insulating layer OIL3 may include an organic material. As an example, at least one of the first organic insulating layer OIL1, the second organic insulating layer OIL2, and the third organic insulating layer OIL3 may include an organic insulating material including a general-purpose polymer such as polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof.

The display element layer DEL may be arranged on the pixel circuit layer PCL. The display element layer DEL may include a display element. In an embodiment, the display element layer DEL may include an organic light-emitting diode OLED as a display element. The organic light-emitting diode OLED may be arranged on the third organic insulating layer OIL3.

The organic light-emitting diode OLED may be electrically connected to the pixel circuit PC. The organic light-emitting diode OLED may be electrically connected to the pixel circuit PC arranged in the third area AR3 to implement the third pixel PX3. The organic light-emitting diode OLED may include a first electrode 211, an emission layer 212, and a second electrode 213.

The pixel electrode 211 may be arranged on the third organic insulating layer OIL3. The pixel electrode 211 may be electrically connected to the connection electrode CM through a contact hole of the first organic insulating layer OIL1, the second organic insulating layer OIL2, and the third organic insulating layer OIL3.

The pixel electrode 211 may include a conductive oxide such as indium tin oxide (ITO), indium zinc oxide (IZO), ZnO, indium oxide ($In_2O_3$), indium gallium oxide (IGO), or aluminum zinc oxide (AZO). In an embodiment, the pixel electrode 211 may include a reflective layer including silver (Ag), magnesium (Mg), aluminum (Al), platinum (Pt), palladium (Pd), gold (Au), nickel (Ni), neodymium (Nd), iridium (Ir), chrome (Cr), or a compound thereof. In an embodiment, the pixel electrode 211 may further include a layer on or under or below the reflective layer, the layer including ITO, IZO, $ZnO_x$, or $In_2O_3$.

The pixel-defining layer 215 may include an opening 215OP exposing the central portion of the pixel electrode 211 and be arranged on the pixel electrode 211. The opening 215OP may define an emission area of light emitted from the organic light-emitting diode OLED.

The pixel-defining layer 215 may include an organic insulating material. In an embodiment, the pixel-defining layer 215 may include an inorganic insulating material such as silicon nitride ($SiN_x$), silicon oxynitride (SiON), and silicon oxide ($SiO_2$). In an embodiment, the pixel-defining layer 215 may include an organic insulating material and an inorganic insulating material. In an embodiment, the pixel-defining layer 215 may include a light-blocking material and be provided in black. The light-blocking material may include carbon black, carbon nanotubes, a resin or paste including black dye. The light-blocking material may include metal particles, for example, nickel, aluminum, molybdenum, an alloy thereof, metal oxide particles (for example, chrome oxide), metal nitride particles (for example, chrome nitride), or the like within the spirit and the scope of the disclosure. In the case where the pixel-defining layer 215 may include a light-blocking material, external light reflection by a metal structure arranged below the pixel-defining layer 215 may be reduced.

The emission layer 212 may be arranged on the pixel electrode 211. The emission layer 212 may overlap the opening 215OP. The emission layer 212 may include a low molecular weight material or a polymer material and may emit red, green, blue, or white light.

In an embodiment, a hole injection layer (HIL) and/or a hole transport layer (HTL) may be arranged between the pixel electrode 211 and the emission layer 212. In an embodiment, the hole transport layer may include poly-3,4-ethylene dioxy thiophene (PEDOT), and the emission layer may include a polymer material such as a polyphenylene vinylene (PPV)-based material and a polyfluorene-based material.

The opposite electrode 213 may be arranged on the emission layer 212. The opposite electrode 213 may include a conductive material having a low work function. As an example, the opposite electrode 213 may include a (semi) transparent layer including silver (Ag), magnesium (Mg), aluminum (Al), platinum (Pt), palladium (Pd), gold (Au), nickel (Ni), neodymium (Nd), iridium (Ir), chrome (Cr), or an alloy thereof. By way of example, the opposite electrode 213 may further include a layer on the (semi) transparent layer, the layer including ITO, IZO, ZnO, or $In_2O_3$.

In an embodiment, an electron transport layer (ETL) and/or an electron injection layer (EIL) may be arranged between the emission layer 212 and the opposite electrode 213.

Figure 6A:
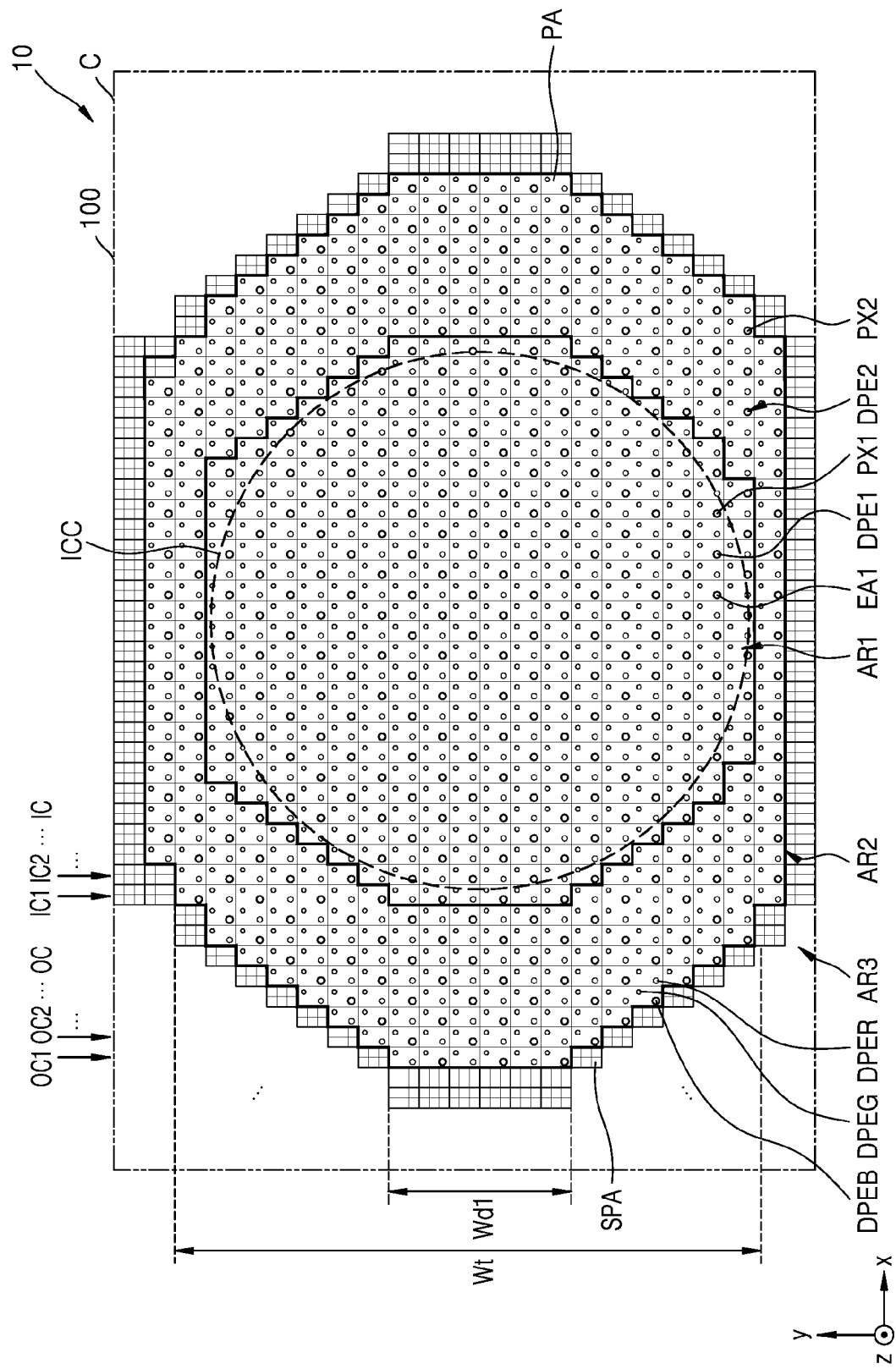
FIG. 6A is an enlarged view of a region C of the display panel of FIG. 4A according to an embodiment.
Figure 6B:
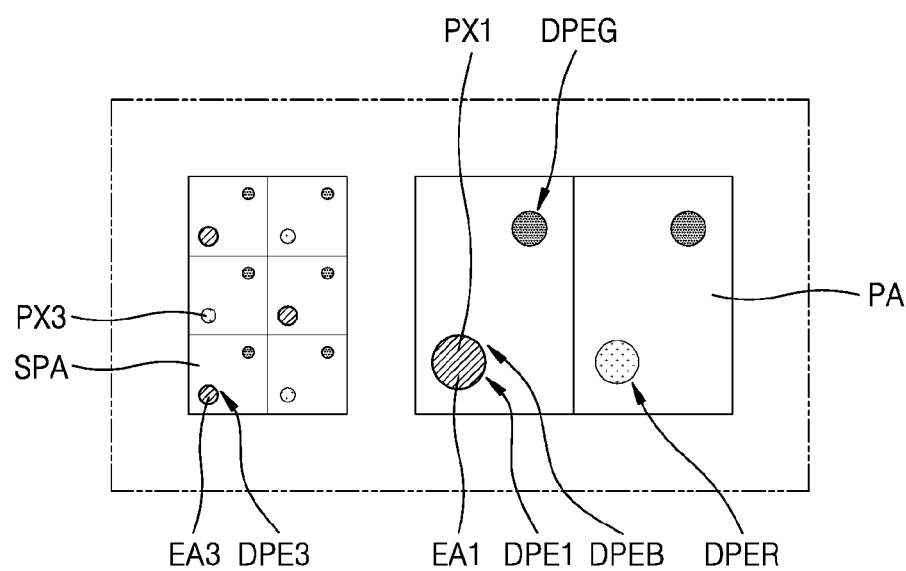
FIG. 6B is an enlarged view of a pixel area and a reduced pixel area of FIG. 6A.
Figure 6C:
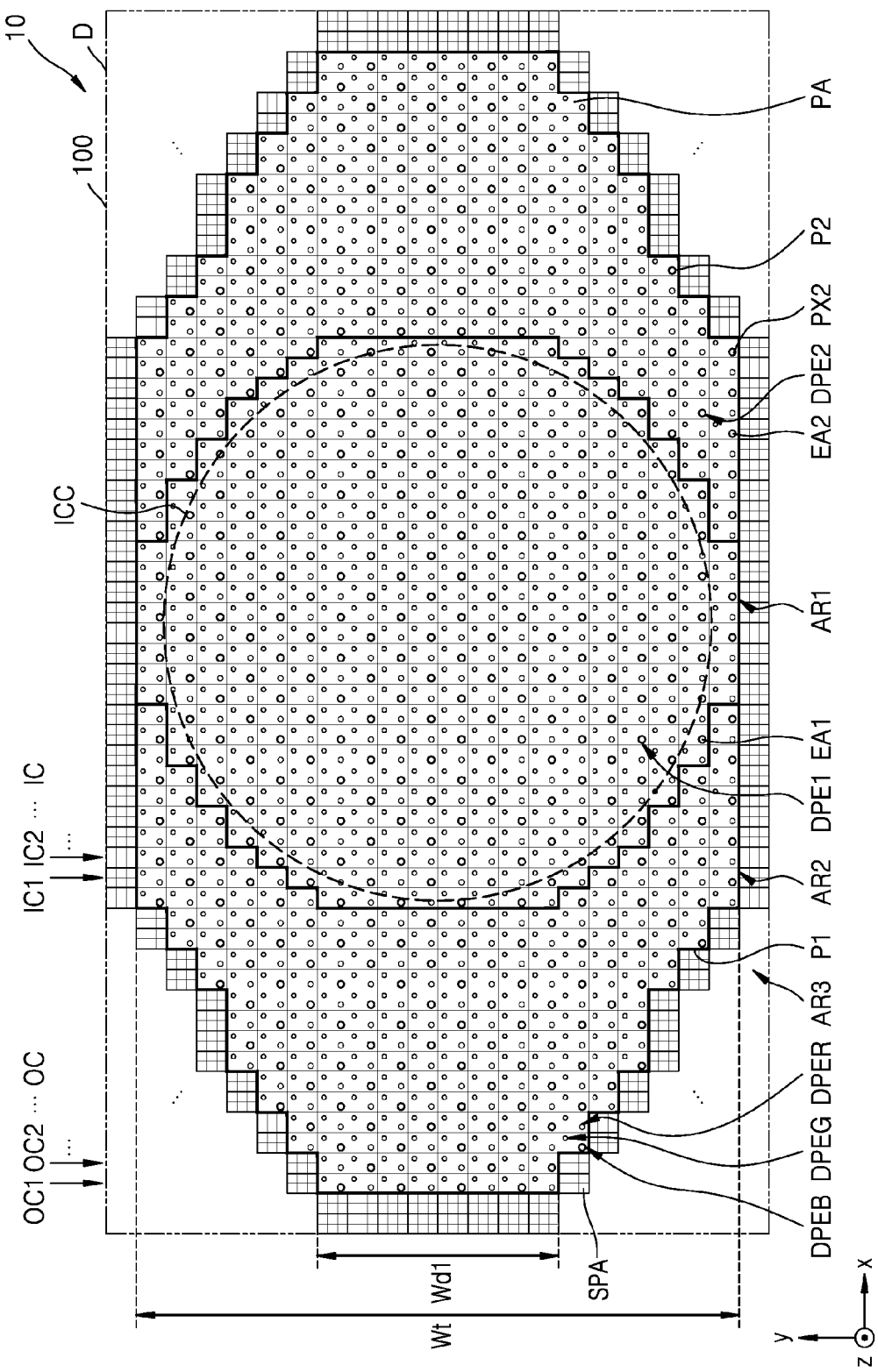
FIGS. 6C and 6D are enlarged views of a region D of the display panel of FIG. 4B according to an embodiment.
Figure 6D:
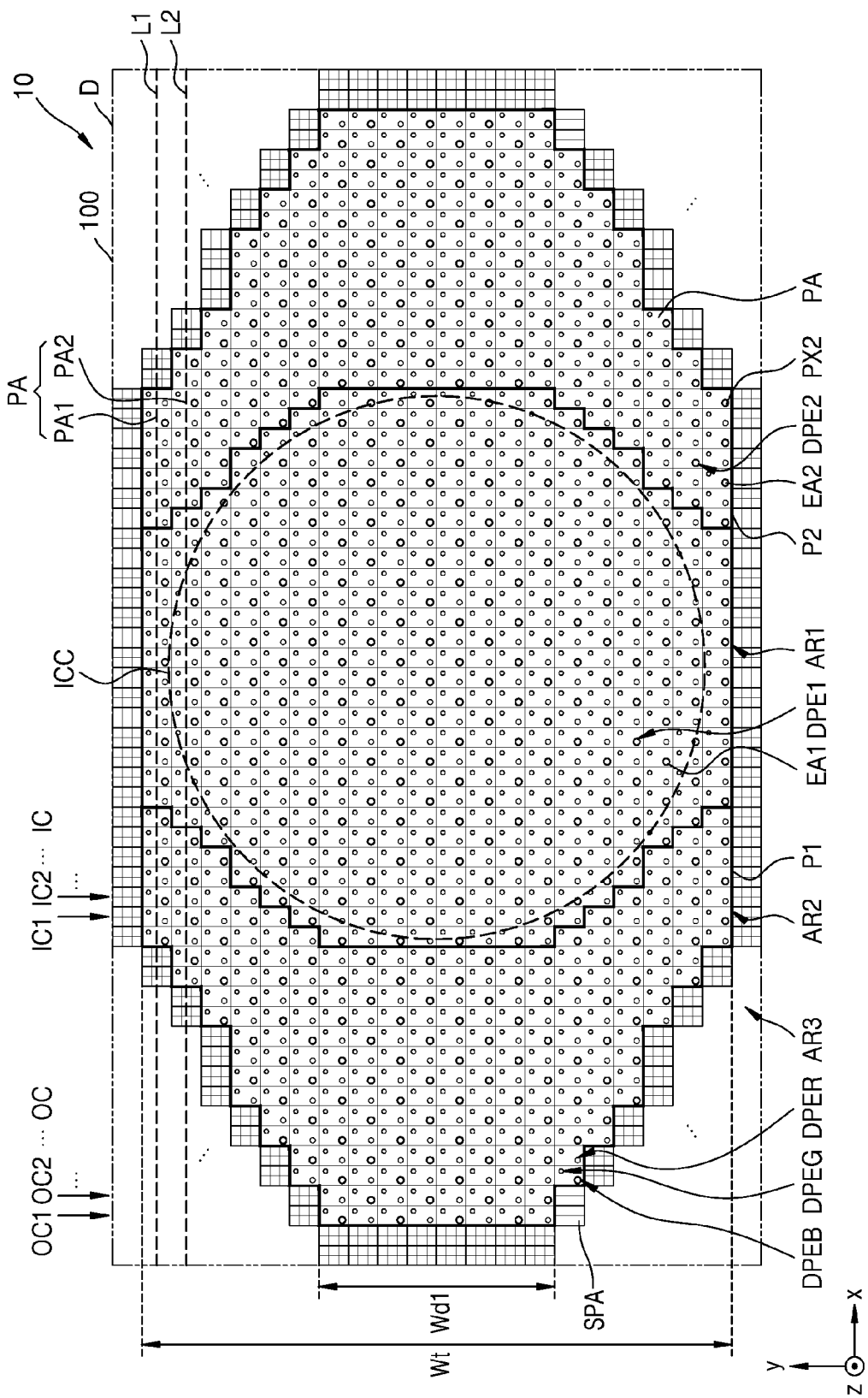

FIG. 6A is an enlarged view of a region C of the display panel 10 of FIG. 4A according to an embodiment. FIG. 6B is an enlarged view of a pixel area PA and a reduced pixel area SPA of FIG. 6A. FIGS. 6C and 6D are enlarged views of a region D of the display panel 10 of FIG. 4B according to an embodiment.

Referring to FIGS. 6A to 6D, the display panel 10 may include the substrate 100, the first display element DPE1, the second display element DPE2, and the third display element DPE3. The substrate 100 may include the first region AR1, the second region AR2, and the third region AR3. In an embodiment, the first area AR1 may have a circular shape or a polygonal shape close to a circular shape. In an embodiment, the first area AR1 may have a polygonal shape overlapping a virtual circle ICC.

The second region AR2 may surround at least a portion of the first region AR1. In an embodiment, the second region AR2 may surround the first region AR1 entirely. As an example, the second area AR2 may extend along the outer periphery of the first area AR1. In an embodiment, the second region AR2 may surround only a portion of the first region AR1.

The first area AR1 and the second area AR2 may each include pixel areas PA. The pixels areas PA may be arranged in the first direction (for example, the x direction or the −x direction) and/or in the second direction (for example, the y direction or the −y direction). In other words, the pixel areas PA may be arranged in each of columns and rows.

In an embodiment, the first direction may cross (or intersect) the second direction. As an example, the first direction and the second direction may form an acute angle, be orthogonal to each other, or may form an obtuse angle. Hereinafter, the case where the first direction (for example, the x direction or the −x direction) and the second direction (for example, the y direction or the −y direction) are orthogonal to each other is described.

The number of pixels PA arranged in the first direction (for example, the x direction or the −x direction) may at least partially vary in the second direction (for example, the y direction or the −y direction). As an example, the number of pixels PA arranged in the first direction (for example, the x direction or the −x direction) and passing through the center of the first area AR1 may be greater than the number of pixels PA arranged in the first direction (for example, the x direction or the −x direction) and passing through the edge of the second area AR2.

The number of pixels PA arranged in the second direction (for example, the y direction or the −y direction) may at least partially vary in the first direction (for example, the x direction or the −x direction). As an example, the number of pixels PA arranged in the second direction (for example, the y direction or the −y direction) and passing through the center of the first area AR1 may be greater than the number of pixels PA arranged in the second direction (for example, the y direction or the −y direction) and passing through the edge of the second area AR2.

An outer column OC may be a column spaced apart from the first area AR1. The outer column OC may extend in the second direction (for example, the y direction or the −y direction) and be spaced apart from the first area AR1 in the first direction (for example, the x direction or the −x direction). The outer column OC may overlap some or a number of the pixel areas PA arranged in the second area AR2. The outer column OC may be provided in plural. As an example, the outer column OC may include a first outer column OC1 and a second outer column OC2.

An inner column IC may overlap at least a portion of the first area AR1. The inner column IC may extend in the second direction (for example, the y direction or the −y direction). The inner column IC may overlap another part of the pixel areas PA arranged in the first area AR1 and the pixel areas PA arranged in the second area AR2. The inner column IC may be provided in plural. As an example, the inner column IC may include a first inner column IC1 and a second inner column IC2.

A width Wd1 of the second area AR2 on the outer column OC may be less than a sum Wt of the width of the first area AR1 and the width of the second area AR2 on the inner column IC. The width Wd1 of the second area AR2 in the outer column OC may be the length of the second area AR2 in the second direction (for example, the y direction or the −y direction). The sum Wt of the width of the first area AR1 and the width of the second area AR2 on the inner column IC may be a sum of the length of the first area AR1 in the second direction (for example, the y direction or the −y direction) and the length of the second area AR2 in the second direction (for example, the y direction or the −y direction) on the inner column IC. In an embodiment, the number of the pixel areas PA on the outer column OC may be less than the number of the pixel areas PA on the inner column IC.

The third region AR3 may surround at least a portion of the second region AR2. In an embodiment, the third area AR3 may surround at least a portion of the first area AR1 and the second area AR2. As an example, the third area AR3 may surround the first area AR1 and the second area AR2 entirely.

The third area AR3 may include reduced pixel areas SPA. The reduced pixel areas SPA may be arranged in the first direction (for example, the x direction or the −x direction) and/or in the second direction (for example, the y direction or the −y direction). In an embodiment, the area of the reduced pixel area SPA may be less than the area of the pixel area PA. As an example, the area of the pixel area PA may be six times the area of the reduced pixel area SPA. The length of the pixel area PA in the first direction (for example, the x direction or the −x direction) may correspond to the length of two reduced pixel areas SPA arranged in the first direction (for example, the x direction or the −x direction). The length of the pixel area PA in the second direction (for example, the y direction or the −y direction) may correspond to the length of three reduced pixel areas SPA arranged in the second direction (for example, the y direction or the −y direction).

The first display element DPE1 may be arranged in the first area AR1. In an embodiment, the first display element DPE1 may be provided in plural. The first display elements DPE1 may be arranged in the first area AR1. In an embodiment, the first display element DPE1 may emit blue, green, or red light. In an embodiment, the first display element DPE1 may emit blue, green, red light, or white light. The first display element DPE1 may include a first emission area EA1. The first emission area EA1 may be a region through which the first display element DPE1 emits light. Accordingly, the first display element DPE1 may implement the first pixel PX1.

The first display element DPE1 may be arranged in the pixel area PA overlapping the first area AR1. In an embodiment, one first display element DPE1 may be arranged in one pixel area PA. In an embodiment, first display elements DPE1 may be arranged in one pixel area PA. As an example, a first display element DPE1 emitting blue light and a first display element DPE1 emitting green light may be arranged in one pixel area PA. In other words, a blue display element DPEB and a green display element DPEG may be arranged in one pixel area PA. The first display element DPE1 emitting blue light and the first display element DPE1 emitting green light may each be adjacent to the corner of the pixel area PA. As another example, a first display element DPE1 emitting red light and a first display element DPE1 emitting green light may be arranged in one pixel area PA. In other words, a red display element DPER and a green display element DPEG may be arranged in one pixel area PA. The first display element DPE1 emitting red light and the first display element DPE1 emitting green light may each be adjacent to the corner of the pixel area PA.

In an embodiment, the area of the blue display element DPEB may be greater than the area of the red display element DPER. In an embodiment, the red display element DPER may be greater than the area of the green display element DPEG.

In an embodiment, a first display element DPE1 emitting blue light and a first display element DPE1 emitting green light may be arranged in one pixel area PA. A first display element DPE1 emitting red light and a first display element DPE1 emitting green light may be arranged in one pixel area PA adjacent to the one pixel area PA.

The second display element DPE2 may be arranged in the second area AR2. In an embodiment, the second display element DPE2 may be provided in plural. The second display elements DPE2 may be arranged in the second area AR2. In an embodiment, the second display element DPE2 may emit blue, green, or red light. In an embodiment, the second display element DPE2 may emit blue, green, red light, or white light. The second display element DPE2 may include a second emission area EA2. The second emission area EA2 may be a region through which the second display element DPE2 emits light. Accordingly, the second display element DPE2 may implement the second pixel PX2. In an embodiment, the arrangement of the second display element DPE2 in the second area AR2 may be the same as or similar to the arrangement of the first display element DPE1 in the first area AR1.

In an embodiment, a first display element DPE1 emitting green light and a second display element DPE2 emitting green light may be arranged side by side in the first direction (for example, the x direction or the −x direction) and/or in the second direction (for example, the y direction or the −y direction). A first display element DPE1 emitting blue or red light and a second display element DPE2 emitting blue or red light may be arranged side by side in the first direction (for example, the x direction or the −x direction) and/or in the second direction (for example, the y direction or the −y direction). Such arrangement of the first display element DPE1 and the second display element DPE2 may be a Pentile Matrix™ configuration.

A third display element DPE3 may be arranged in the third area AR3. In an embodiment, the third display element DPE3 may be provided in plural. The third display elements DPE3 may be arranged in the third area AR3. In an embodiment, the third display element DPE3 may emit blue, green, or red light. In an embodiment, the third display element DPE3 may emit blue, green, red light, or white light. The third display element DPE3 may include a third emission area EA3. The third emission area EA3 may be a region through which the third display element DPE3 emits light. Accordingly, the third display element DPE3 may implement the third pixel PX3. In an embodiment, third display elements DPE3 may be arranged in Pentile Matrix™ configuration.

The third emission area EA3 may be less than one of the first emission area EA1 and the second emission area EA2. The number of third pixels PX3 per unit area in the third area AR3 may be greater than the number of first pixels PX1 per unit area in the first area AR1. The number of third pixels PX3 per unit area in the third area AR3 may be greater than the number of second pixels PX2 per unit area in the second area AR2. Accordingly, the resolution of the display panel 10 in the third area AR3 may be greater than the resolution of the display panel 10 in the first area AR1 and the resolution of the display panel 10 in the second area AR2.

Unlike this embodiment, in the case where the second area AR2 does not surround at least a portion of the outer periphery of the first area AR1 and is arranged in only one side or a side and another side of the first area AR1, the first area AR2 may have a rectangular shape. The areas of the first area AR1 and the second area AR2 may increase, and the first area AR1 and the second area AR2 may be readily recognized by a user due to a difference in resolution from the third area AR3. In this embodiment, the width Wd1 of the second area AR2 on the outer column OC may be less than the sum Wt of the width of the first area AR1 and the width of the second area AR2 in the inner column IC. Accordingly, even though there is a difference in resolution between the first area AR1 and the second area AR2, and the third area AR3, a user may not readily recognize the difference, and thus, aesthetic sense may increase.

Referring to FIGS. 6C and 6D, the second area AR2 may include a first part P1 and a second part P2 arranged with the first area AR1 therebetween. The first part P1 may be adjacent to the first area AR1 on one side or a side of the first area AR1, and the second part P2 may be adjacent to the first area AR1 on another side of the first area AR1. Though it is shown in FIGS. 6C and 6D that the first part P1 is spaced apart from the second part P2, the first part P1 and the second part P2 may be provided in one region or a region in an embodiment. The second region AR2 may surround the first region AR1 entirely.

Referring to FIG. 6D, the pixel areas PA may include first pixel areas PA1 and second pixel areas PA2. The first pixel areas PA1 may overlap a virtual first extension line L1 extending in the first direction (for example, the x direction or the −x direction). In other words, the first pixel areas PA1 may be pixel areas PA arranged on one row. The second pixel areas PA2 may overlap a virtual second extension line L2 extending in the first direction (for example, the x direction or the −x direction). In other words, the second pixel areas PA2 may be pixel areas PA arranged on one row. The virtual second extension line L2 may be adjacent to the virtual first extension line L1. Accordingly, the first pixel areas PA1 may be respectively adjacent to the second pixel areas PA2 in the second direction (for example, the y direction or the −y direction).

A difference between the number of the first pixel areas PA1 and the number of the second pixel areas PA2 may be a multiple of 4. As an example, a difference between the number of the first pixel areas PA1 and the number of the second pixel areas PA2 may be 4, 8, 12, 16, or the like within the spirit and the scope of the disclosure. Accordingly, a sum of the width of the first area AR1 and the width of the second area AR2 in the first direction (for example, the x direction or the −x direction) may be drastically reduced from the center of the first area AR1 to the edge of the first area AR1 in the second direction (for example, the y direction or the −y direction). Even though there is a difference in resolution between the first area AR1 and the second area AR2, and the third area AR3, a user may not readily recognize the difference, and thus, aesthetic sense may increase.

Figure 7:
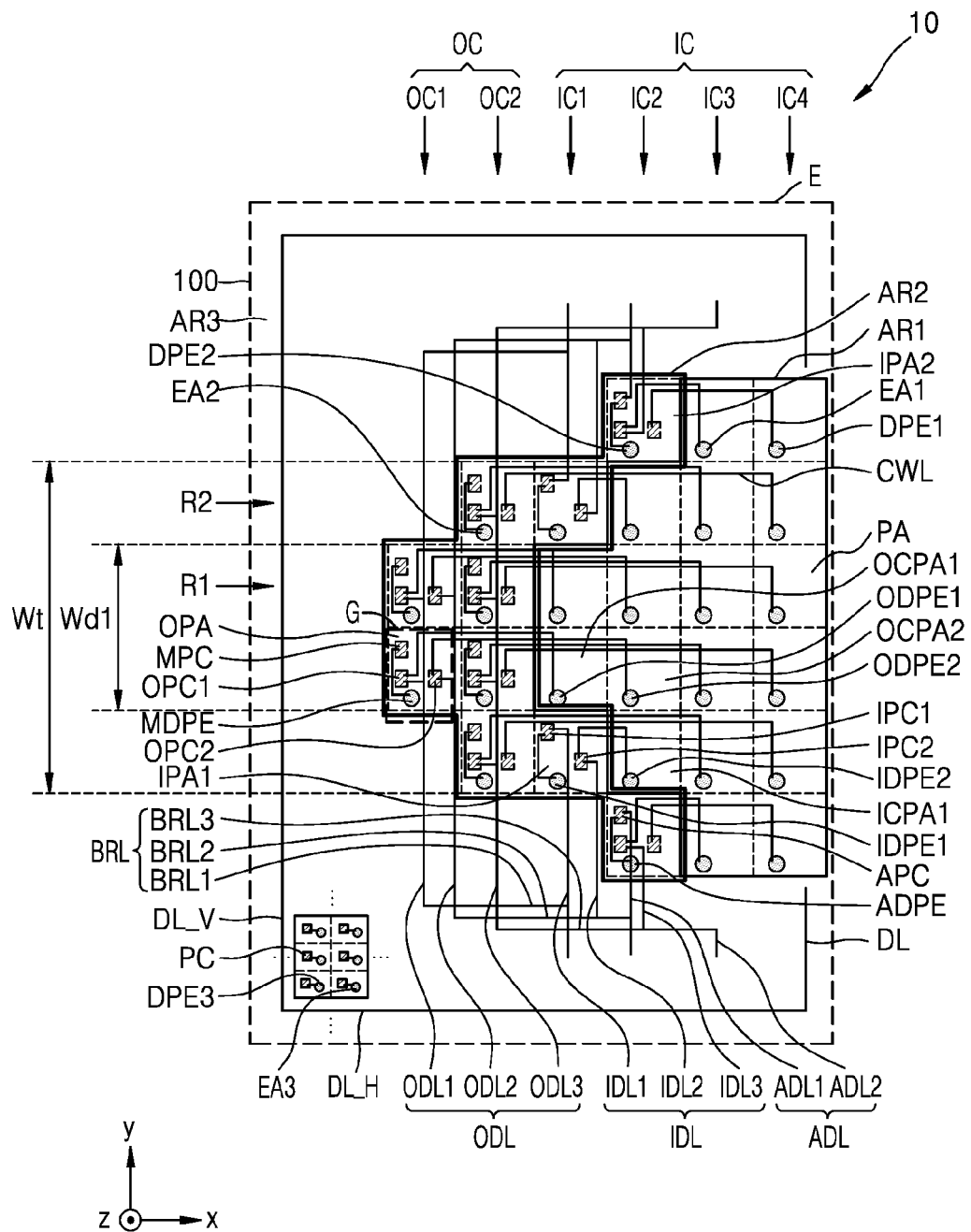
FIG. 7 is an enlarged view of a region E of the display panel of FIG. 4A according to an embodiment.

FIG. 7 is an enlarged view of a region E of the display panel 10 of FIG. 4A according to an embodiment. FIG. 8 is an enlarged view of an outer pixel area OPA, a first outer corresponding pixel area OCPA1, a second outer corresponding pixel area OCPA2, a first inner pixel area IPA1, and a first inner corresponding pixel area ICPA1 of FIG. 7 according to an embodiment. In FIGS. 7 and 8, the same reference numerals as those of FIGS. 6A and 6B denote the same members, and thus, repeated descriptions thereof are omitted.

Referring to FIGS. 7 and 8, the display panel 10 may include the substrate 100, an outer data line ODL, an inner data line IDL, a bridge line BRL, an additional data line ADL, the first outer pixel circuit OPC1, the second outer pixel circuit OPC2, an intermediate pixel circuit MPC, the connection line CWL, a first inner pixel circuit IPC1, a second inner pixel circuit IPC2, the first display element DPE1, the second display element DPE2, and the third display element DPE3. The substrate 100 may include the first region AR1, the second region AR2, and the third region AR3. The second region AR2 may surround at least a portion of the first region AR1.

The first area AR1 and the second area AR2 may each include pixel areas PA. The pixels areas PA may be arranged in the first direction (for example, the x direction or the −x direction) and/or in the second direction (for example, the y direction or the −y direction). In other words, the pixel areas PA may be arranged along columns and rows.

The outer column OC may be a column spaced apart from the first area AR1. The outer column OC may extend in the second direction (for example, the y direction or the −y direction) and be spaced apart from the first area AR1 in the first direction (for example, the x direction or the −x direction). The outer column OC may overlap some or a number of the pixel areas PA arranged in the second area AR2. The outer column OC may be provided in plural. As an example, the outer column OC may include the first outer column OC1 and the second outer column OC2.

The pixel areas PA may include the outer pixel area OPA overlapping the outer column OC. In an embodiment, the pixel areas PA may include outer pixel areas OPA overlapping the outer column OC.

The inner column IC may overlap at least a portion of the first area AR1. The inner column IC may extend in the second direction (for example, the y direction or the −y direction). The inner column IC may overlap another part of the pixel areas PA arranged in the first area AR1 and the pixel areas PA arranged in the second area AR2. The inner column IC may be provided in plural. As an example, the inner column IC may include the first inner column IC1, the second inner column IC2, a third inner column IC3, and a fourth inner column IC4.

The pixel areas PA may include the first inner pixel area IPA1 overlapping the first inner column IC1. In an embodiment, the pixel areas PA may include the first inner pixel area IPA1 overlapping the first inner column IC1, the second inner pixel area IPA2 overlapping the second inner column IC2, the third inner pixel area overlapping the third inner column IC3, and the fourth inner pixel area overlapping the fourth inner column IC4. The pixel areas PA may include the first outer corresponding pixel area OCPA1 and the second outer corresponding pixel area OCPA2, wherein the first outer corresponding pixel area OCPA1 is arranged in the first area AR1 and overlaps the first inner column IC1, and the second outer corresponding pixel area OCPA2 overlaps the second inner column IC2. The pixel areas PA may include the first inner corresponding pixel area ICPA1 arranged in one of the first area AR1 and the second area AR2 and overlapping the first inner column IC1.

The width Wd1 of the second area AR2 in the outer column OC may be less than the sum Wt of the width of the first area AR1 and the width of the second area AR2 on the inner column IC. In an embodiment, the number of the pixel areas PA on the outer column OC may be less than the number of the pixel areas PA on the inner column IC.

The third region AR3 may surround at least a portion of the second region AR2. The third area AR3 may include reduced pixel areas SPA. The reduced pixel areas SPA may be arranged in the first direction (for example, the x direction or the −x direction) and/or in the second direction (for example, the y direction or the −y direction). In an embodiment, the area of the reduced pixel area SPA may be less than the area of the pixel area PA.

The outer data line ODL may transfer data signals and may extend along the outer column OC. The outer data line ODL may extend in the second direction (for example, the y direction or the −y direction). The outer data line ODL may extend from the third area AR3 to the second area AR2. The outer data line ODL may overlap the second area AR2. In an embodiment, the outer data line ODL may include a first outer data line ODL1, a second outer data line ODL2, and a third outer data line ODL3. In an embodiment, the first outer data line ODL1 and the second outer data line ODL2 may extend along the first outer column OC1. The third outer data line ODL3 may extend along the second outer column OC2.

The inner data line IDL may extend along the inner column IC. The inner data line IDL may extend in the second direction (for example, the y direction or the −y direction). In an embodiment, the inner data line IDL may include a first inner data line IDL1, a second inner data line IDL2, and a third inner data line IDL3. The first inner data line IDL1 and the second inner data line IDL2 may each extend along the first inner column IC1. The third inner data line IDL3 may extend along the second inner column IC2.

The inner data line IDL may be electrically connected to the outer data line ODL. The first inner data line IDL1 may be electrically connected to the first outer data line ODL1. Accordingly, the first inner data line IDL1 and the first outer data line ODL1 may transfer the same first signal. The second inner data line IDL2 may be electrically connected to the second outer data line ODL2. Accordingly, the second inner data line IDL2 and the second outer data line ODL2 may transfer the same second signal. The third inner data line IDL3 may be electrically connected to the third outer data line ODL3. Accordingly, the third inner data line IDL3 and the third outer data line ODL3 may transfer the same third signal.

The inner data line IDL may extend from the second area AR3. As an example, the first inner data line IDL1 overlapping the first inner column IC1 may extend from the third area in the second direction (for example, the y direction or the −y direction). Though not shown, the first inner data line IDL1 may be electrically connected to the pixel circuit PC overlapping the first inner column IC1 and arranged in the third area AR3.

The outer data line ODL may be electrically connected to the inner data line IDL through a bridge line BRL. The bridge line BRL may extend in the first direction (for example, the x direction or the −x direction). The bridge line BRL may be arranged on a layer different from the outer data line ODL and the inner data line IDL. In an embodiment, an insulating layer may be arranged on the bridge line BRL. The outer data line ODL and the inner data line IDL may be arranged on the insulating layer. The bridge line BRL may be electrically connected to the outer data line ODL through a contact hole of the insulating layer. The bridge line BRL may be electrically connected to the inner data line IDL through a contact hole of the insulating layer. As an example, the bridge line BRL may be arranged between the inorganic insulating layer IIL (see FIG. 5) and the lower organic insulating layer LOIL (see FIG. 5). The outer data line ODL and the inner data line IDL may be arranged between the lower organic insulating layer LOIL (see FIG. 5) and the first organic insulating layer OIL1 (see FIG. 5).

The bridge line BRL may include a first bridge line BRL1, a second bridge line BRL2, and a third bridge line BRL3. The first bridge line BRL1 may electrically connect the first outer data line ODL1 to the first inner data line IDL1. The second bridge line BRL2 may electrically connect the second outer data line ODL2 to the second inner data line IDL2. The third bridge line BRL3 may electrically connect the third outer data line ODL3 to the third inner data line IDL3.

An additional data line ADL may extend in the second direction (for example, the y direction or the −y direction). In an embodiment, the additional data line ADL may include a first additional data line ADL1 and a second additional data line ADL2.

The first additional data line ADL1 may be electrically connected to the second inner data line IDL2. The first additional data line ADL1 may be electrically connected to an additional pixel circuit APC overlapping the second inner column IC2 and arranged in the second area AR2. The first additional data line ADL1 may extend from the second area AR2 to the third area AR3. Though not shown, accordingly, the first additional data line ADL1 may be electrically connected to the pixel circuit PC overlapping the second inner column IC2 and arranged in the third area AR3.

The second additional data line ADL2 may be electrically connected to the third inner data line IDL3. The second additional data line ADL2 may extend along the third inner column IC3. Accordingly, though not shown, the second additional data line ADL2 may be electrically connected to the pixel circuit PC arranged in the third area AR3.

The first outer pixel circuit OPC1 may drive the first display element DPE1 arranged in the first area AR1. The first outer pixel circuit OPC1 may be arranged in the outer pixel area OPA. The first outer pixel circuit OPC1 may be electrically connected to the first outer data line ODL1. The first outer pixel circuit OPC1 may receive a first data signal from the first outer data line ODL1. In an embodiment, the first outer pixel circuit OPC1 may be electrically connected to the first outer data line ODL1 through an intermediate bridge line MBRL. In an embodiment, the intermediate bridge line MBRL may be arranged on a layer different from the first outer data line ODL1.

The second outer pixel circuit OPC2 may drive the first display element DPE1 arranged in the first area AR1. The second outer pixel circuit OPC2 may be arranged in the outer pixel area OPA. In an embodiment, the second outer pixel circuit OPC2 may be arranged with the first outer pixel circuit OPC1 side by side in the first direction (for example, the x direction or the −x direction). As an example, the first outer pixel circuit OPC1 may be arranged with the second outer pixel circuit OPC2 side by side in a row direction.

The second outer pixel circuit OPC2 may be electrically connected to the second outer data line ODL2. The second outer pixel circuit OPC2 may receive a second data signal from the second outer data line ODL2. In an embodiment, similar to the first outer data line ODL1, the second outer data line ODL2 may be electrically connected to the second outer pixel circuit OPC2 through a wiring arranged on a different layer.

The intermediate pixel circuit MPC may drive the second display element DPE2 arranged in the second area AR2. The intermediate pixel circuit MPC may be arranged in the second area AR2. In an embodiment, the intermediate pixel circuit MPC may be arranged in the outer pixel area OPA. The intermediate pixel circuit MPC may be arranged with one of the first outer pixel circuit OPC1 and the second outer pixel circuit OPC2 side by side in the second direction (for example, the y direction or the −y direction). As an example, the intermediate pixel circuit MPC may be arranged with the first outer pixel circuit OPC1 side by side in the second direction (for example, the y direction or the −y direction). As another example, though not shown, the intermediate pixel circuit MPC may be arranged with the second outer pixel circuit OPC2 side by side in the second direction (for example, the y direction or the −y direction).

In this embodiment, the display panel 10 may include the first outer pixel circuit OPC1 arranged in the outer pixel area OPA, the second outer pixel circuit OPC2 arranged with the first outer pixel circuit OPC1 side by side in the first direction (for example, the x direction or the −x direction), and the intermediate pixel circuit MPC arranged with one of the first outer pixel circuit OPC1 and the second outer pixel circuit OPC2 side by side in the second direction (for example, the y direction or the −y direction). Accordingly, all of the first outer pixel circuit OPC1, the second outer pixel circuit OPC2, and the intermediate pixel circuit MPC may be arranged in one outer pixel area OPA.

The first inner pixel circuit IPC1 may be arranged in the first inner pixel area IPA1. The first inner pixel circuit IPC1 may be electrically connected to the first inner data line IDL1. The first inner pixel circuit IPC1 may receive a first data signal from the first inner data line IDL1. Accordingly, even though the first inner pixel circuit IPC1 overlapping the first inner column IC1 and the first outer pixel circuit OPC1 overlapping the first outer column OC1 are respectively arranged on different columns, the first inner pixel circuit IPC1 and the first outer pixel circuit OPC1 may receive the same first data signal.

The second inner pixel circuit IPC2 may be arranged in the first inner pixel area IPA1. The second inner pixel circuit IPC2 may be electrically connected to the second inner data line IDL2. The second inner pixel circuit IPC2 may receive a second data signal from the second inner data line IDL2. Accordingly, even though the second inner pixel circuit IPC2 overlapping the first inner column IC1 and the second outer pixel circuit OPC2 overlapping the first outer column OC1 are respectively arranged on different columns, the second inner pixel circuit IPC2 and the second outer pixel circuit OPC2 may receive the same second data signal.

The additional pixel circuit APC may be arranged in the second area AR2 and may overlap the second inner column IC2. The additional pixel circuit APC may be electrically connected to the first additional data line ADL1. The additional pixel circuit APC may receive the second data signal from the first additional data line ADL1. Accordingly, even though the additional pixel circuit APC overlapping the second inner column IC2, the second inner pixel circuit IPC2 overlapping the first inner column IC1, and the second outer pixel circuit OPC2 overlapping the first outer column OC1 are respectively arranged on different columns, the additional pixel circuit APC, the second inner pixel circuit IPC2, and the second outer pixel circuit OPC2 may receive the same second data signal.

The connection line CWL may extend from the second area AR2 to the first area AR1. The connection line CWL may extend in a direction from the outer column OC to the inner column IC. Connection lines CWL may extend in a direction crossing or intersecting the outer column OC and the inner column IC. The connection line CWL may include a transparent conductive oxide.

The connection line CWL may be provided in plural. The number of the connection lines CWL arranged on a first row R1 crossing or intersecting the outer column OC may be different from the number of the connection lines CWL arranged on a second row R2 different from the first row R1. In the case where the second row R2 is closer the edge of the first area AR1 in the second direction (for example, the y direction or the −y direction) than the first row R1, the number of the connection lines CWL arranged on the second row R2 may be less than the number of the connection lines CWL arranged on the first row R1. As an example, the number of the connection lines CWL arranged on the second row R2 may be 3, and the number of the connection lines CWL arranged on the first row R1 may be 4.

The first display element DPE1 may be arranged in the first area AR1. In an embodiment, the first display element DPE1 may be provided in plural. The first display elements DPE1 may be arranged in the first area AR1. The first display element DPE1 may include the first emission area EA1. The first emission area EA1 may be a region through which the first display element DPE1 emits light.

The first display element DPE1 may include the first outer display element ODPE1 overlapping the first inner column IC1 and electrically connected to the first outer pixel circuit OPC1. The first outer display element ODPE1 may be arranged in the first outer corresponding pixel area OCPA1. The first outer display element ODPE1 may be electrically connected to the first outer pixel circuit OPC1 through the connection line CWL.

The first display element DPE1 may include the second outer display element ODPE2 overlapping the second inner column IC2 and electrically connected to the second outer pixel circuit OPC2. The second outer display element ODPE2 may be arranged in the second outer corresponding pixel area OCPA2. The second outer display element ODPE2 may be electrically connected to the second outer pixel circuit OPC2 through the connection line CWL.

Accordingly, the pixel circuit may not be arranged in the first area AR1. A light or sound transmittance of the display panel 10 in the first area AR1 may increase.

The second display element DPE2 may be arranged in the second area AR2. In an embodiment, the second display element DPE2 may be provided in plural. The second display elements DPE2 may be arranged in the second area AR2. The second display element DPE2 may include the second emission area EA2. The second emission area EA2 may be a region through which the second display element DPE2 emits light.

The second display element DPE2 may include an intermediate display element MDPE. The intermediate display element MDPE may be provided in plural in the second area AR2. The intermediate display element MDPE may be electrically connected to the intermediate pixel circuit MPC. The intermediate display element MDPE may be electrically connected to the intermediate pixel circuit MPC through the connection electrode CM. The intermediate display element MDPE may be electrically connected to the intermediate pixel circuit MPC arranged inside the outer pixel area OPA.

The second display element DPE2 may include the first inner display element IDPE1 overlapping the first inner pixel area IPA1 and electrically connected to the first inner pixel circuit IPC1. The first outer pixel circuit OPC1 and the first inner pixel circuit IPC1 may receive the first data signal. In an embodiment, the first outer pixel circuit OPC1 and the first inner pixel circuit IPC1 may respectively receive different scan signals and be driven independently.

The second display element DPE2 may include an additional display element ADPE overlapping the second inner column IC2 and electrically connected to the additional pixel circuit APC. The additional display element ADPE may be electrically connected to the additional pixel circuit APC. The additional display element ADPE may be electrically connected to the additional pixel circuit APC arranged inside of the same pixel area.

One of the first display element DPE1 and the second display element DPE2 may include the second inner display element IDPE2 overlapping the second inner column IC2 and electrically connected to the second inner pixel circuit IPC2. The second inner display element IDPE2 may be arranged in the first inner corresponding pixel area ICPA1. In an embodiment, the first inner corresponding pixel area ICPA1 may be arranged in one of the first area AR1 and the second area AR2. The second inner display element IDPE2 may be electrically connected to the second inner pixel circuit IPC2 through the connection line CWL.

The third display element DPE3 may be arranged in the third area AR3. The third display element DPE3 may be arranged in the reduced pixel area SPA. The reduced pixel area SPA may be provided in plural. The reduced pixel areas SPA may surround the first area AR1 and the second area AR2. In an embodiment, the third display element DPE3 may be provided in plural. The third display elements DPE3 may be arranged in the third area AR3. The third display element DPE3 may include the third emission area EA3. The third emission area EA3 may be a region through which the third display element DPE3 emits light.

The third emission area EA3 may be less than one of the first emission area EA1 and the second emission area EA2. The number of third display elements DPE3 per unit area in the third area AR3 may be greater than the number of first display elements DPE1 per unit area in the first area AR1.

In this embodiment, the width Wd1 of the second area AR2 on the outer column OC may be less than the sum Wt of the width of the first area AR1 and the width of the second area AR2 in the inner column IC. Accordingly, even though there is a difference in resolution between the first area AR1 and the second area AR2, and the third area AR3, a user may not readily recognize the difference, and thus, aesthetic sense may increase.

Such a characteristic is because the display panel 10 may include the first outer data line ODL1 and the first inner data line IDL1, wherein the first outer data line ODL1 extends along the outer column OC spaced apart from the first area AR1, and the first inner data line IDL1 extends along the first inner column IC1 overlapping at least a portion of the first area AR1 and is electrically connected to the first outer data line ODL1. Accordingly, the first outer pixel circuit OPC1 overlapping the outer pixel area OPA and the first inner pixel circuit IPC1 overlapping the first inner pixel area IPA1 may receive the same data signal. The second area AR2 may surround the outer periphery of the first area AR1.

According to an embodiment, because the first outer pixel circuit OPC1, the second outer pixel circuit OPC2, and the intermediate pixel circuit MPC are arranged in the outer pixel area OPA, the area of the second area AR2 may be reduced. Because the first inner pixel circuit IPC1 and the second inner pixel circuit IPC2 are arranged in the first inner pixel area IPA1, the area of the second area AR2 may be additionally reduced. Accordingly, even though there is a difference in resolution between the first area AR1 and the second area AR2, and the third area AR3, a user may not readily recognize the difference, and thus, aesthetic sense may increase.

The data line DL, a horizontal data line DL_H, and a vertical data line DL_V may be further arranged in the third area AR3. The data line DL may extend in the second direction (for example, the y direction or the −y direction) in the third area AR3. In an embodiment, the data line DL may not overlap the first area AR1.

The data line DL may transfer data signals to the pixel circuit PC arranged in the third area AR3. In an embodiment, though not shown, the data line DL may transfer data signals to the pixel circuit PC arranged on the same column as the data line DL.

The data line DL may be electrically connected to the horizontal data line DL_H. The horizontal data line DL may extend in the first direction (for example, the x direction or the −x direction) in the third area AR3. The horizontal data line DL_H may be electrically connected to the vertical data line DL_V. The vertical data line DL_V may extend in the second direction (for example, the y direction or the −y direction) in the third area AR3.

The data line DL, the horizontal data line DL_H, and the vertical data line DL_V may detour the first area AR1. Accordingly, even though a portion of the data line DL arranged on the same column is disconnected from another portion of the data line DL with respect to the first area AR1, the portion of the data line DL arranged on the same column may be electrically connected to the other portion of the data line DL through the horizontal data line DL_H and the vertical data line DL_V. Accordingly, the portion of the data line DL and the other portion of the data line DL arranged on the same column may transfer the same data signal.

Figure 9A:
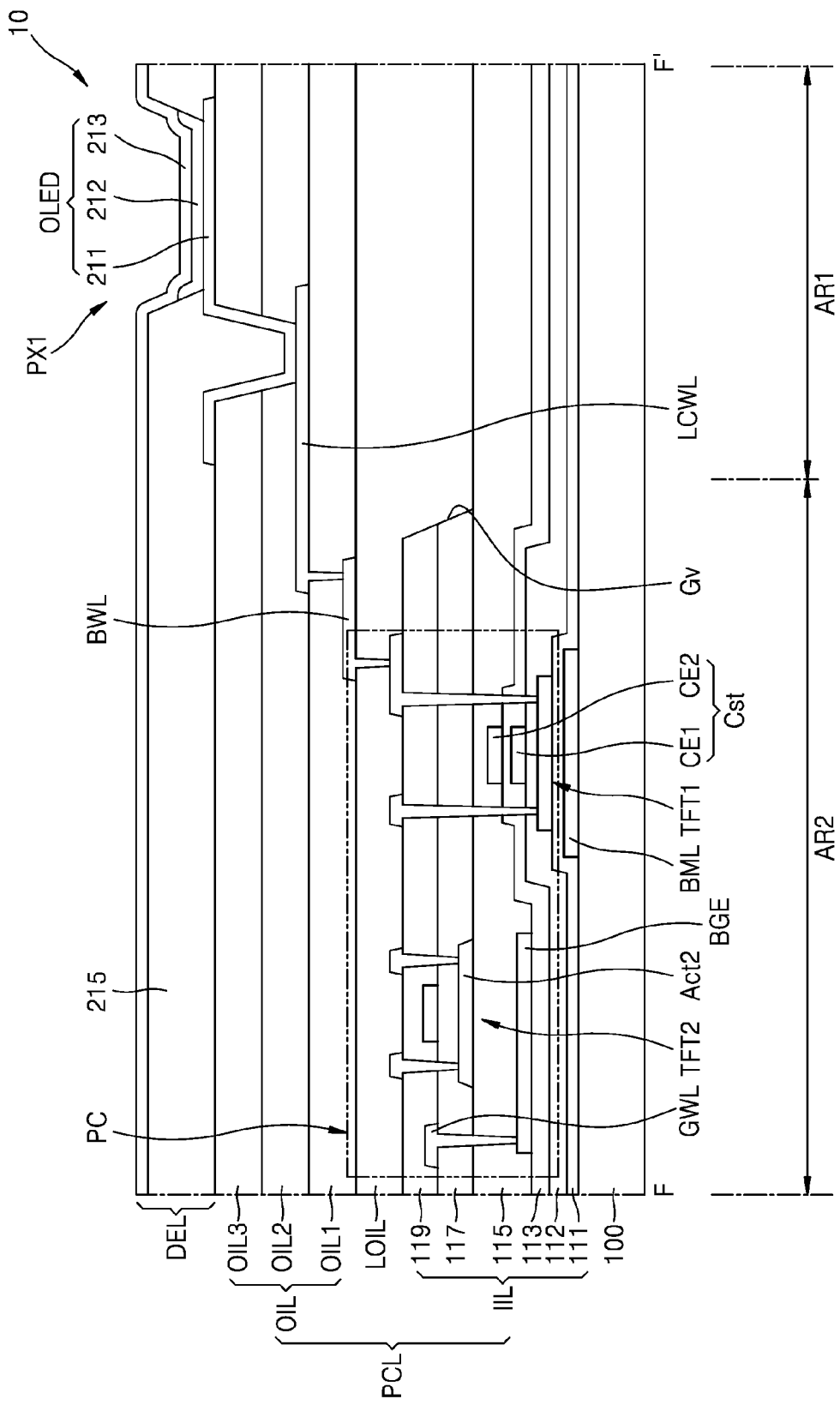
FIGS. 9A and 9B are schematic cross-sectional views of the display panel, taken along line F-F' of FIG. 8.
Figure 9B:
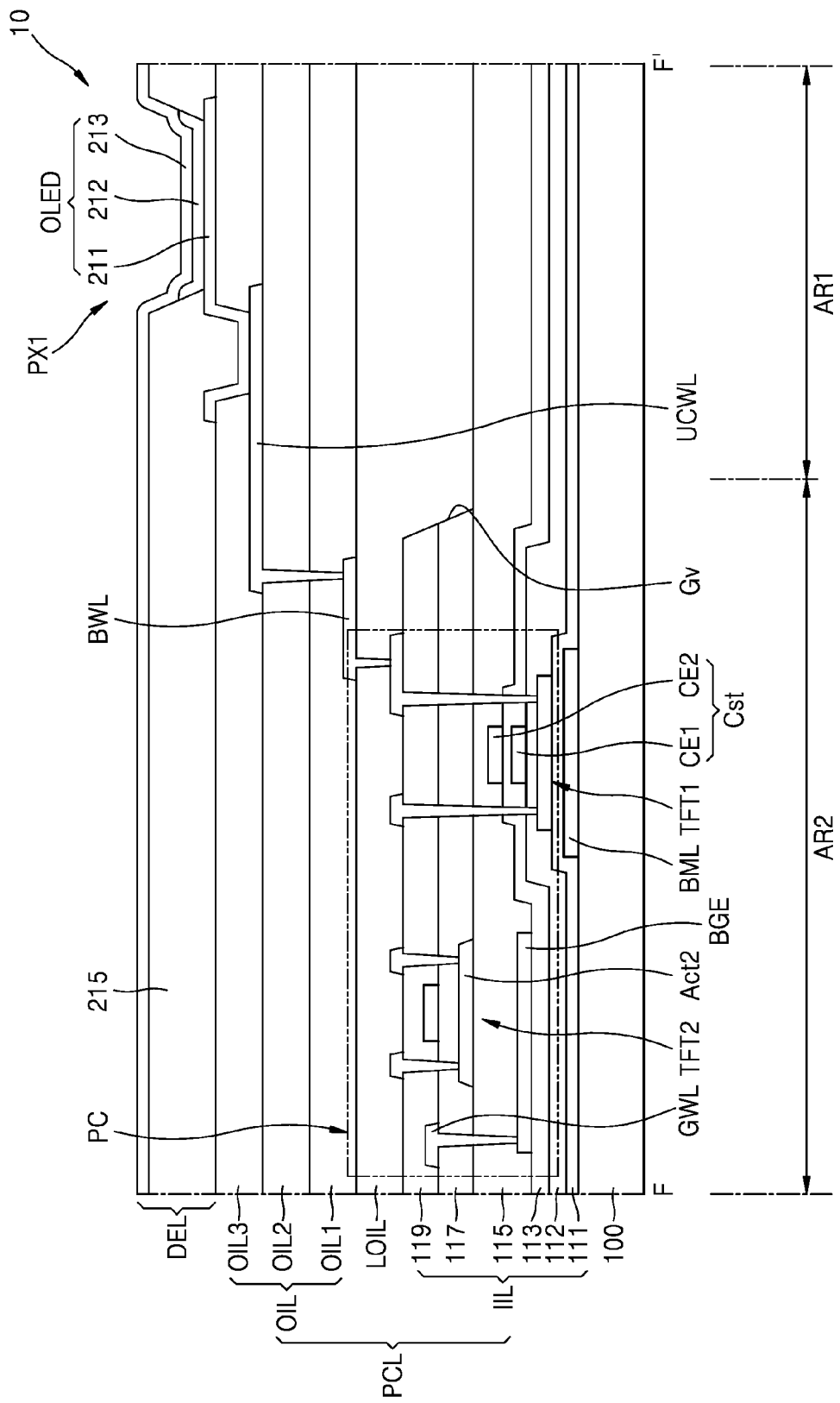

FIGS. 9A and 9B are schematic cross-sectional views of the display panel 10, taken along line F-F' of FIG. 8. In FIGS. 9A and 9B, the same reference numerals as those of FIG. 5 denote the same members, and thus, repeated descriptions thereof are omitted.

Referring to FIGS. 9A and 9B, the display panel 10 may include the substrate 100, the pixel circuit layer PCL, and the display element layer DEL. In an embodiment, the substrate 100 may include the first area AR1 and the second area AR2. The display element layer DEL may include the organic light-emitting diode OLED. The organic light-emitting diode OLED may be one of the first display element and the second display element. Hereinafter, the case where the organic light-emitting diode OLED is the first display element is described in detail.

The organic light-emitting diode OLED as the first display element may implement the first pixel PX1. The organic light-emitting diode OLED as the first display element may be arranged in first area AR1.

The pixel circuit layer PCL may be arranged on the substrate 100. The pixel circuit layer PCL may include the pixel circuit PC, the inorganic insulating layer IIL, the lower organic insulating layer LOIL, a connection bridge line BWL, the connection electrode CM, the organic insulating layer OIL, and the connection line CWL. In an embodiment, the inorganic insulating layer IIL may include the buffer layer 111, the first gate insulating layer 112, the second gate insulating layer 113, the first insulating layer 115, the second insulating layer 117, and the interlayer insulating layer 119.

The pixel circuit PC may be arranged in the second area AR2. The pixel circuit PC may not be arranged in the first area AR1. The pixel circuit PC may include the first thin-film transistor T1, the second thin-film transistor T2, and the storage capacitor Cst.

In an embodiment, the inorganic insulating layer IIL may include a groove Gv or a hole overlapping the first area AR1. The groove Gv may have a shape formed by removing a portion of the inorganic insulating layer IIL. As an example, the buffer layer 111, the first gate insulating layer 112, the second gate insulating layer 113, and the first insulating layer 115 may be continuously arranged in the first area AR1 and the second area AR2. The second insulating layer 117 and the interlayer insulating layer 119 may each include an opening overlapping the first area AR1. The opening of the second inorganic insulating layer 117 and the opening of the interlayer insulating layer 119 may be respectively formed by separate processes, or simultaneously formed by the same process. In the case where the opening of the second inorganic insulating layer 117 and the opening of the interlayer insulating layer 119 are respectively formed by separate processes, the groove Gv may have a step difference shape.

The lower organic insulating layer LOIL may fill the groove Gv. A transmittance of the lower organic insulating layer LOIL may be greater than the transmittance (for example, a light transmittance) of the second inorganic insulating layer 117 and/or the interlayer insulating layer 119. Accordingly, the transmittance (for example, a light transmittance) of the first area AR1 may increase.

Though it is shown in FIGS. 9A and 9B that the groove Gv is provided, the inorganic insulating layer IIL may not include the groove Gv in an embodiment. The second inorganic insulating layer 117 and the interlayer insulating layer 119 may be continuously arranged in the first area AR1. In an embodiment, the inorganic insulating layer IIL may expose the upper surface of the substrate 100 overlapping the first area AR1.

The connection bridge line BWL may be arranged on the lower organic insulating layer LOIL. The connection bridge line BWL may include a material having high conductivity. The connection bridge line BWL may include a conductive material including molybdenum (Mo), aluminum (Al), copper (Cu), and titanium (Ti) and have a single-layered structure or a multi-layered structure including the above materials. In an embodiment, the connection bridge line BWL may have a multi-layered structure of Ti/Al/Ti.

The organic insulating layer OIL may be arranged on the lower organic insulating layer LOIL. The organic insulating layer OIL may cover or overlap the connection bridge line BWL. In an embodiment, the organic insulating layer OIL may include the first organic insulating layer OIL1, the second organic insulating layer OIL2, and the third organic insulating layer OIL3 that may be sequentially stacked each other.

The connection line CWL may extend from the second area AR2 to the first area AR1. The connection line CWL may include a transparent conductive oxide. In an embodiment, the connection line CWL may be provided in plural. In an embodiment, the connection lines CWL may include at least one of a connection line LCWL and an upper connection line UCWL.

Referring to FIG. 9A, the lower connection line LCWL may be arranged between the first organic insulating layer OIL1 and the second organic insulating layer OIL2. The lower connection line LCWL may be electrically connected to the connection bridge line BWL through a contact hole of the first organic insulating layer OIL1. The lower connection line LCWL may be electrically connected to the organic light-emitting diode OLED through a contact hole of the second organic insulating layer OIL2 and a contact hole of the third organic insulating layer OIL3. Accordingly, the organic light-emitting diode OLED arranged in the first area AR1 may be electrically connected to the pixel circuit PC arranged in the second area AR2, and driven by the pixel circuit PC arranged in the second area AR2.

Referring to FIG. 9B, the upper connection line UCWL may be arranged between the second organic insulating layer OIL2 and the third organic insulating layer OIL3. The upper connection line UCWL may be electrically connected to the connection bridge line BWL through a contact hole of the first organic insulating layer OIL1 and a contact hole of the second organic insulating layer OIL2. The upper connection line UCWL may be electrically connected to the organic light-emitting diode OLED through a contact hole of the third organic insulating layer OIL3. Accordingly, the organic light-emitting diode OLED arranged in the first area AR1 may be electrically connected to the pixel circuit PC arranged in the second area AR2, and driven by the pixel circuit PC arranged in the second area AR2.

Referring to FIG. 8, the first outer pixel circuit OPC1, the second outer pixel circuit OPC2, and the intermediate pixel circuit MPC may be arranged in one outer pixel area OPA. Unlike this embodiment, in the case where the lower connection line LCWL is arranged between the inorganic insulating layer IIL and the lower organic insulating layer LOIL, both the lower connection line LCWL and the pixel circuit PC may not be arranged. In this embodiment, the lower connection line LCWL may be arranged between the first organic insulating layer OIL1 and the second organic insulating layer OIL2, and the lower connection line LCWL may be arranged in the outer pixel area OPA together with the first outer pixel circuit OPC1, the second outer pixel circuit OPC2, and the intermediate pixel circuit MPC.

Figure 10:
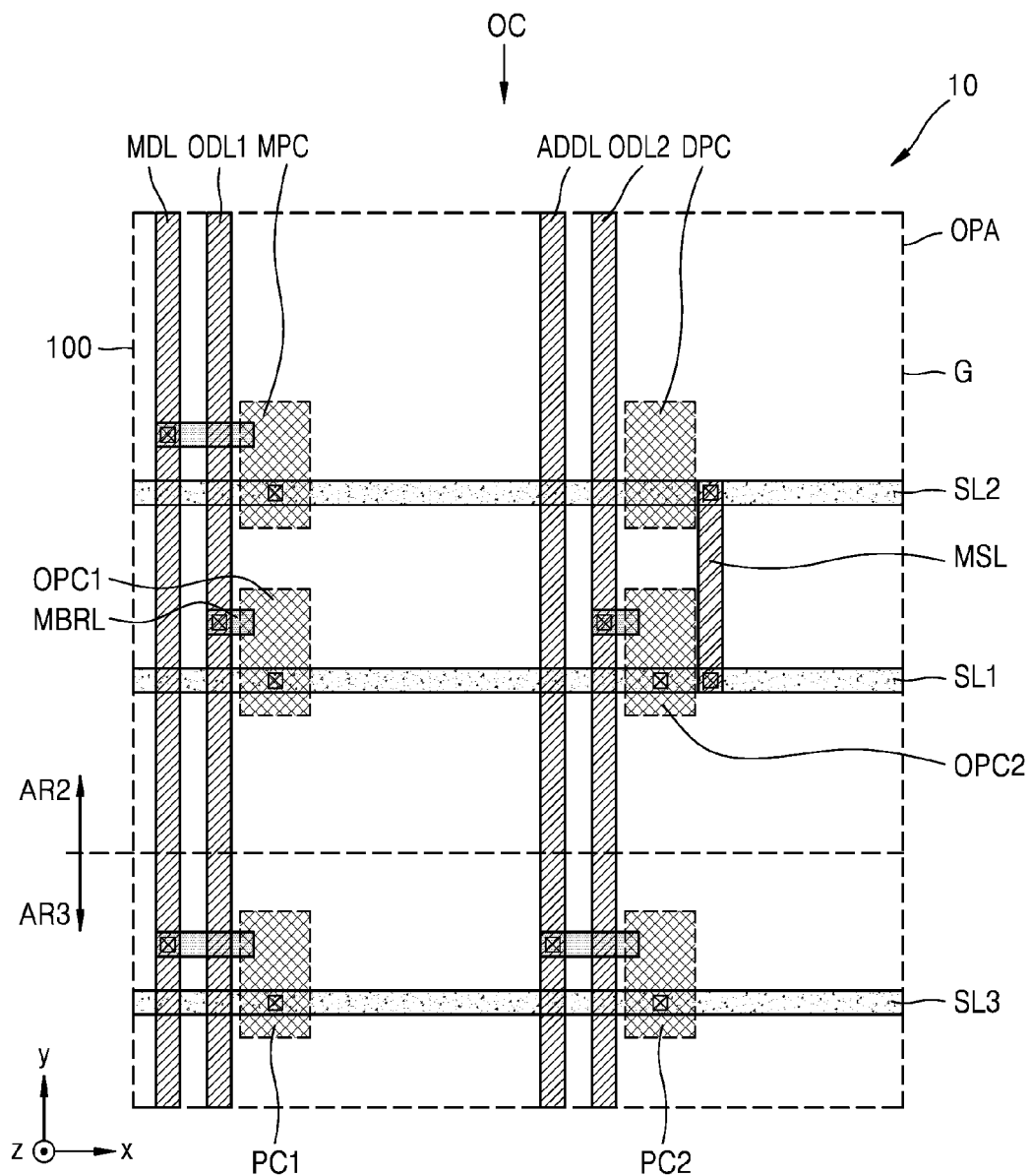
FIG. 10 is an enlarged view of a region G of the display panel of FIG. 7 according to an embodiment.

FIG. 10 is an enlarged view of a region G of the display panel 10 of FIG. 7 according to an embodiment.

Referring to FIG. 10, the display panel 10 may include the first outer data line ODL1, the second outer data line ODL2, an intermediate data line MDL, an adjacent data line ADDL, the first outer pixel circuit OPC1, the second outer pixel circuit OPC2, the intermediate pixel circuit MPC, the first pixel circuit PC1, the second pixel circuit PC2, a dummy pixel circuit DPC, the first scan line SL1, the second scan line SL2, the third scan line SL3, and an intermediate scan line MSL. The substrate 100 may include the second area AR2 and the third area AR3. The third region AR3 may surround at least a portion of the second region AR2.

The first outer data line ODL1 may transfer data signals to the first outer pixel circuit OPC1. The first outer data line ODL1 may extend in the second direction (for example, the y direction or the −y direction). The first outer data line ODL1 may extend along the outer column OC. The first outer data line ODL1 may extend from the third area AR3 to the second area AR2.

The second outer data line ODL2 may transfer data signals to the second outer pixel circuit OPC2. The second outer data line ODL2 may extend in the second direction (for example, the y direction or the −y direction). The second outer data line ODL2 may extend along the outer column OC. The second outer data line ODL2 may extend from the third area AR3 to the second area AR2.

The intermediate data line MDL may transfer data signals to the intermediate pixel circuit MPC and the first pixel circuit PC1. The intermediate data line MDL may extend in the second direction (for example, the y direction or the −y direction). The intermediate data line MDL may extend along the outer column OC. The intermediate data line MDL may extend from the third area AR3 to the second area AR2.

The adjacent data line ADDL may transfer data signals to the second pixel circuit PC2. The adjacent data line ADDL may extend in the second direction (for example, the y direction or the −y direction). The adjacent data line ADDL may extend along the outer column OC. The adjacent data line ADDL may be parallel to the intermediate data line MDL. The adjacent data line ADDL may extend from the third area AR3 to the second area AR2.

The first outer pixel circuit OPC1, the second outer pixel circuit OPC2, and the intermediate pixel circuit MPC may each be arranged in the outer pixel area OPA. In an embodiment, the first outer pixel circuit OPC1 may be arranged with the second outer pixel circuit OPC2 side by side in the first direction (for example, the x direction or the −x direction). The intermediate pixel circuit MPC may be arranged with one of the first outer pixel circuit OPC1 and the second outer pixel circuit OPC2 side by side in the second direction (for example, the y direction or the −y direction). As an example, the intermediate pixel circuit MPC may be arranged with the first outer pixel circuit OPC1 side by side in the second direction (for example, the y direction or the −y direction).

The first pixel circuit PC1 and the second pixel circuit PC2 may be arranged in the third area AR3 to be adjacent to the outer pixel area OPA. In an embodiment, the first pixel circuit PC1 may be arranged with the second pixel circuit PC2 side by side in the first direction (for example, the x direction or the −x direction). In an embodiment, the first pixel circuit PC1 may be electrically connected to the intermediate data line MDL. The second pixel circuit PC2 may be electrically connected to the adjacent data line ADDL.

The first pixel circuit PC1 and the intermediate pixel circuit MPC may each be electrically connected to the intermediate data line MDL. Accordingly, the first pixel circuit PC1 and the intermediate pixel circuit MPC may receive the same data signal. Accordingly, the number of data lines arranged in the outer column OC may be reduced.

In an embodiment, the dummy pixel circuit DPC may be arranged in the outer pixel area OPA. In an embodiment, the dummy pixel circuit DPC may be arranged with one of the first outer pixel circuit OPC1 and the second outer pixel circuit OPC2 side by side in the second direction (for example, the y direction or the −y direction). In an embodiment, the dummy pixel circuit DPC may be omitted.

The first scan line SL1 may transfer scan signals to the first outer pixel circuit OPC1 and the second outer pixel circuit OPC2. The first scan line SL1 may extend in the first direction (for example, the x direction or the −x direction).

The second scan line SL2 may transfer scan signals to the intermediate pixel circuit MPC. The second scan line SL2 may extend in the first direction (for example, the x direction or the −x direction). In an embodiment, the first scan line SL1 and the second scan line SL2 may transfer the same scan signal. The first scan line SL1 may be electrically connected to the second scan line SL2. As an example, the first scan line SL1 may be electrically connected to the second scan line SL2 through the intermediate scan line MSL. Though it is shown in FIG. 10 that the intermediate scan line MSL is arranged in the outer pixel area OPA, the intermediate scan line MSL may not be arranged in the outer pixel area OPA in an embodiment.

The third scan line SL3 may be electrically connected to the first pixel circuit PC1. In an embodiment, the third scan line SL3 may be electrically connected to each of the first pixel circuit PC1 and the second pixel circuit PC2. The third scan line SL3 and the first scan line SL1 may each transfer scan signals independently. Accordingly, even though the first pixel circuit PC1 and the intermediate pixel circuit MPC are electrically connected to the same intermediate data line MDL, the first pixel circuit PC1 and the intermediate pixel circuit MPC may be driven independently.

FIG. 11 is an enlarged view of an outer pixel area OPA, a first outer corresponding pixel area OCPA1, a second outer corresponding pixel area OCPA2, a first inner pixel area IPA1, and a first inner corresponding pixel area ICPA1 of FIG. 7 according to an embodiment. In FIG. 11, the same reference numerals as those of FIG. 8 denote the same members, and thus, repeated descriptions thereof are omitted.

Referring to FIG. 11, the display panel may include the substrate 100, the first outer data line ODL1, the second outer data line ODL2, the first inner data line IDL1, the second inner data line IDL2, the first outer pixel circuit OPC1, the second outer pixel circuit OPC2, the first inner pixel circuit IPC1, the second inner pixel circuit IPC2, the intermediate pixel circuit MPC, the connection electrode CM, the connection line CWL, the first display element DPE1, and the second display element DPE2. The substrate 100 may include the first region AR1, the second region AR2, and the third region AR3. The second region AR2 may surround at least a portion of the first region AR1.

In an embodiment, the first display element DPE1 may emit blue, green, or red light. In an embodiment, the first display element DPE1 may emit blue, green, red light, or white light.

The first display element DPE1 may be provided in plural. The first display elements DPE1 may be arranged in the first area AR1. The first display elements DPE1 may be arranged in Pentile Matrix™ configuration. In an embodiment, the first display elements DPE1 may be arranged in the first outer corresponding pixel area OCPA1 and the second outer corresponding pixel area OCPA2. One of the first display elements DPE1 arranged in one pixel area may emit blue light or red light. Another of the first display elements DPE1 arranged in one pixel area may emit green light.

In an embodiment, the second display element DPE2 may emit blue, green, or red light. In an embodiment, the second display element DPE2 may emit blue, green, red light, or white light.

The second display element DPE2 may be provided in plural. The second display elements DPE2 may be arranged in the second area AR2. The second display elements DPE2 may be arranged in Pentile Matrix™ configuration. In an embodiment, the second display elements DPE2 may be arranged in the first outer pixel area OPA1, the second outer pixel area OPA2, and the first inner pixel area IPA1. In an embodiment, one of the second display elements DPE2 arranged in one pixel area may emit blue light or red light. Another of the second display elements DPE2 arranged in one pixel area may emit green light.

Accordingly, the first outer data line ODL1, the second outer data line ODL2, the first inner data line IDL1, the second inner data line IDL2, and the additional data line ADL may each be provided in plural per column. The first outer pixel circuit OPC1, the second outer pixel circuit OPC2, the first inner pixel circuit IPC1, the second inner pixel circuit IPC2, the intermediate pixel circuit MPC, the connection electrode CM, the intermediate bridge line MBRL, and the connection line CWL may each be provided in plural per pixel area.

Figure 12:
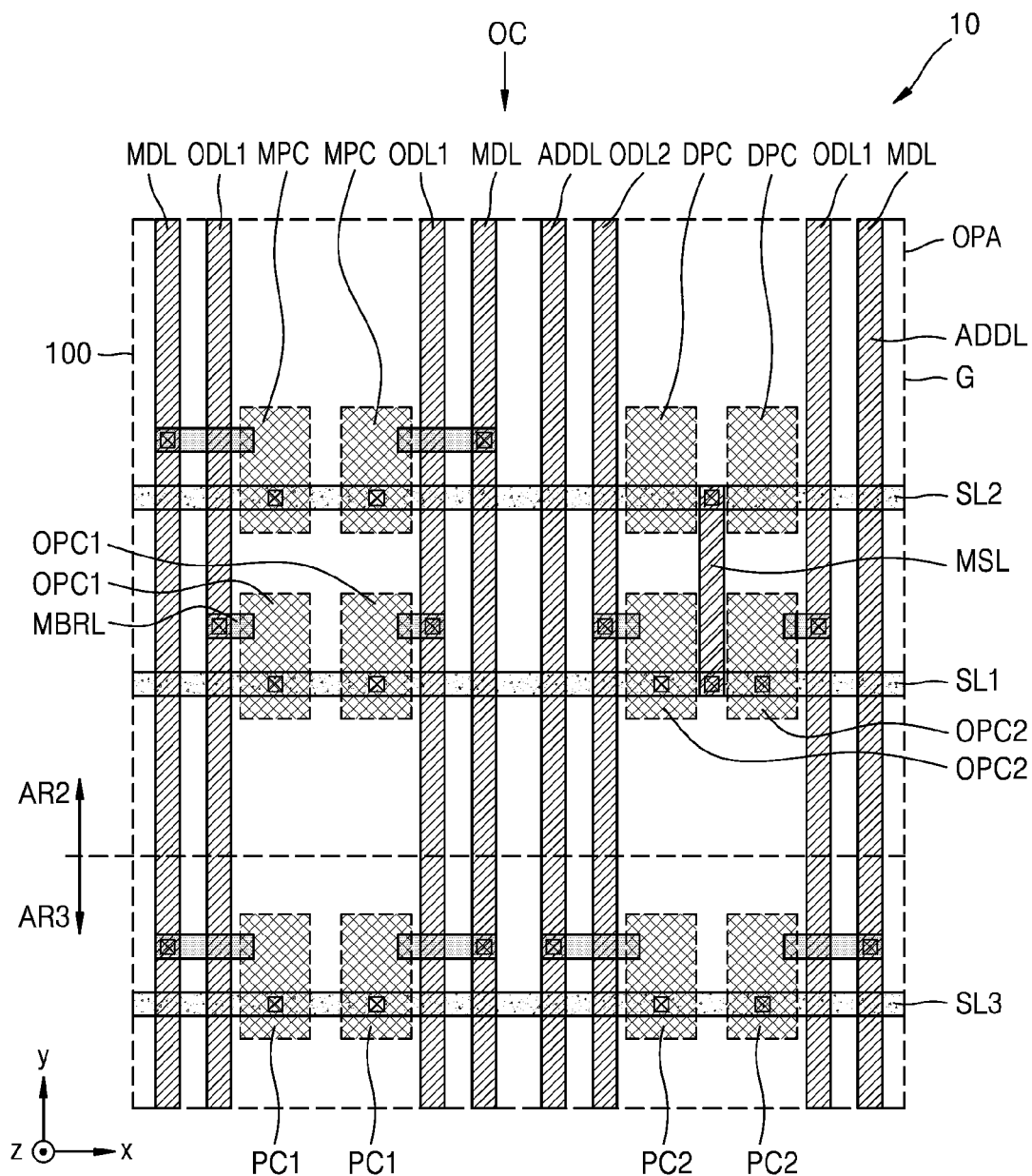
FIG. 12 is an enlarged view of a region G of the display panel of FIG. 7 according to an embodiment.

FIG. 12 is an enlarged view of a region G of the display panel 10 of FIG. 7 according to an embodiment. In FIG. 12, the same reference numerals as those of FIG. 10 denote the same members, and thus, repeated descriptions thereof are omitted.

Referring to FIG. 12, the display panel 10 may include the first outer data line ODL1, the second outer data line ODL2, an intermediate data line MDL, an adjacent data line ADDL, the first outer pixel circuit OPC1, the second outer pixel circuit OPC2, the intermediate pixel circuit MPC, the first pixel circuit PC1, the second pixel circuit PC2, a dummy pixel circuit DPC, the first scan line SL1, the second scan line SL2, the third scan line SL3, and an intermediate scan line MSL. The substrate 100 may include the second area AR2 and the third area AR3. The third region AR3 may surround at least a portion of the second region AR2.

The first outer pixel circuit OPC1, the second outer pixel circuit OPC2, the first pixel circuit PC1, the second pixel circuit PC2, the intermediate pixel circuit MPC, and the dummy pixel circuit DPC may each be provided in plural per pixel area. In an embodiment, the first outer data line ODL1, the second outer data line ODL2, the intermediate data line MDL, and the adjacent data line ADDL may each be provided in plural per column.

As described above, the display apparatus according to an embodiment may include the first outer pixel circuit arranged in the outer pixel area, the second outer pixel circuit arranged with the first outer pixel circuit side by side in the first direction, and the intermediate pixel circuit arranged side by side with one of the first outer pixel circuit and the second outer pixel circuit. Accordingly, all of the first outer pixel circuit, the second outer pixel circuit, and the intermediate pixel circuit may be arranged in the outer pixel area.

In the display apparatus according to an embodiment, the first pixel circuit overlapping the third area and adjacent to the outer pixel area, and the intermediate pixel circuit may each be electrically connected to the same intermediate data line. Accordingly, the number of data lines electrically connected to the pixel circuit may be reduced.

The second area may have a shape extending along the outer periphery of the first area through such a configuration of the pixel circuit, and even though there is a difference in resolution between the first area AR1 and the second area AR2, and the third area AR3, a user may not readily recognize the difference, and thus, aesthetic sense may increase.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure and as defined by the following claims.

What is claimed is:

1. A display apparatus comprising:
   a substrate including:
   a first region;
   a second region; and
   a third region, the second region including an outer pixel area that overlaps an outer column spaced apart from the first region in a plan view and surrounding at least a portion of the first region, and the third region surrounding at least a portion of the second region;
   a first outer pixel circuit disposed in the outer pixel area;
   a second outer pixel circuit disposed in the outer pixel area, the second outer pixel circuit being adjacent to the first outer pixel circuit in a first direction;
   an intermediate pixel circuit disposed in the outer pixel area, the intermediate pixel circuit being adjacent to one of the first outer pixel circuit and the second outer pixel circuit in a second direction intersecting the first direction;
   a first display element disposed in the first region and including:
   a first outer display element; and
   a second outer display element; and
   a second display element including an intermediate display element overlapping the outer pixel area and electrically connected to the intermediate pixel circuit, wherein
   the first outer display element overlaps a first inner column in the plan view,
   the first inner column overlaps at least a portion of the first region in the plan view,
   the first outer display element is electrically connected to the first outer pixel circuit,
   the second outer display element overlaps at least a portion of the first region and a second inner column different from the first inner column in the plan view, and
   the second outer display element is electrically connected to the second outer pixel circuit.

2. The display apparatus of claim 1, further comprising:
   a first outer data line extending along the outer column and electrically connected to the first outer pixel circuit;
   an intermediate data line extending along the outer column and electrically connected to the intermediate pixel circuit; and
   a first pixel circuit disposed in the third region to be adjacent to the outer pixel area and electrically connected to the intermediate data line.

3. The display apparatus of claim 2, further comprising:
   a first scan line electrically connected to each of the first outer pixel circuit and the second outer pixel circuit;
   a second scan line electrically connected to the intermediate pixel circuit; and
   a third scan line electrically connected to the first pixel circuit,
   wherein the first scan line and the second scan line transfer a same scan signal.

4. The display apparatus of claim 2, further comprising:
a second outer data line extending along the outer column and electrically connected to the second outer pixel circuit;
an adjacent data line extending along the outer column; and
a second pixel circuit disposed in the third region to be adjacent to the outer pixel area and electrically connected to the adjacent data line.

5. The display apparatus of claim 1, wherein
the second region includes a first inner pixel area overlapping the first inner column in the plan view,
the display apparatus includes:
    a first outer data line extending along the outer column and electrically connected to the first outer pixel circuit;
    a second outer data line extending along the outer column and electrically connected to the second outer pixel circuit;
    a first inner data line electrically connected to the first outer data line and extending along the first inner column;
    a second inner data line electrically connected to the second outer data line and extending along the first inner column;
    a first inner pixel circuit disposed in the first inner pixel area and electrically connected to the first inner data line; and
    a second inner pixel circuit disposed in the first inner pixel area and electrically connected to the second inner data line,
the second display element includes a first inner display element disposed in the first inner pixel area and electrically connected to the first inner pixel circuit, and
one of the first display element and the second display element includes a second inner display element overlapping the second inner column in the plan view and electrically connected to the second inner pixel circuit.

6. The display apparatus of claim 5, further comprising:
connection lines, each of the connection lines extending from the second region to the first region and each of the connection lines including a transparent conductive oxide,
wherein a number of the connection lines disposed on a first row intersecting the outer column is different from a number of the connection lines disposed on a second row different from the first row.

7. The display apparatus of claim 6, further comprising:
an organic insulating layer disposed between the first outer pixel circuit and the first display element and including a first organic insulating layer, a second organic insulating layer, and a third organic insulating layer sequentially stacked each other, wherein
the connection lines include at least one of a lower connection line and an upper connection line,
the lower connection line is disposed between the first organic insulating layer and the second organic insulating layer, and
the upper connection line is disposed between the second organic insulating layer and the third organic insulating layer.

8. The display apparatus of claim 5, further comprising:
a first connection line extending from the outer column to the second inner column and electrically connecting the second outer pixel circuit to the second outer display element; and
a second connection line extending from the first inner column to the second inner column and electrically connecting the second inner pixel circuit to the second inner display element,
wherein the first inner column is disposed between the outer column and the second inner column.

9. The display apparatus of claim 1, further comprising:
a third display element disposed in the third region and including an emission area smaller than at least one of an emission area of the first display element and an emission area of the second display element.

10. The display apparatus of claim 1, wherein the second region extends along an outer periphery of the first region.

11. A display apparatus comprising:
a substrate including:
    a first region;
    a second region; and
    a third region, the second region including an outer pixel area that overlaps an outer column spaced apart from the first region in a plan view and surrounding at least a portion of the first region, and the third region surrounding at least a portion of the second region;
a first outer pixel circuit disposed in the outer pixel area;
a second outer pixel circuit disposed in the outer pixel area, the second outer pixel circuit being adjacent to the first outer pixel circuit in a first direction;
an intermediate pixel circuit disposed in the outer pixel area, the intermediate pixel circuit being adjacent to one of the first outer pixel circuit and the second outer pixel circuit in a second direction intersecting the first direction;
a first pixel circuit disposed in the third region to be adjacent to the outer pixel area;
a first outer data line extending along the outer column and electrically connected to the first outer pixel circuit;
a second outer data line extending along the outer column and electrically connected to the second outer pixel circuit;
an intermediate data line extending along the outer column and electrically connected to each of the intermediate pixel circuit and the first pixel circuit;
a first display element including a first outer display element and a second outer display element, the first outer display element being disposed in the first region and electrically connected to the first outer pixel circuit, and the second outer display element being electrically connected to the second outer pixel circuit; and
a second display element including an intermediate display element disposed in the outer pixel area and electrically connected to the intermediate pixel circuit.

12. The display apparatus of claim 11, further comprising:
a first scan line electrically connected to each of the first outer pixel circuit and the second outer pixel circuit;
a second scan line electrically connected to the intermediate pixel circuit; and
a third scan line electrically connected to the first pixel circuit,
wherein the first scan line and the second scan line transfer a same scan signal.

13. The display apparatus of claim 11, further comprising:
an adjacent data line extending along the outer column; and
a second pixel circuit disposed in the third region to be adjacent to the outer pixel area and electrically connected to the adjacent data line.

14. The display apparatus of claim 11, wherein
the first outer display element overlaps a first inner column in the plan view,
the first inner column overlaps at least a portion of the first region in the plan view,
the second outer display element overlaps a second inner column in the plan view, and
the second inner column overlaps at least a portion of the first region in the plan view and is different from the first inner column.

15. The display apparatus of claim 14, wherein
the second region includes a first inner pixel area overlapping the first inner column in the plan view, and
the display apparatus includes:
- a first inner data line electrically connected to the first outer data line and extending along the first inner column;
- a second inner data line electrically connected to the second outer data line and extending along the first inner column;
- a first inner pixel circuit disposed in the first inner pixel area and electrically connected to the first inner data line;
- a second inner pixel circuit disposed in the first inner pixel area and electrically connected to the second inner data line,
the second display element includes a first inner display element disposed in the first inner pixel area and electrically connected to the first inner pixel circuit, and
one of the first display element and the second display element includes a second inner display element overlapping the second inner column in the plan view and electrically connected to the second inner pixel circuit.

16. The display apparatus of claim 15, further comprising:
connection lines each extending from the second region to the first region and including a transparent conductive oxide,
wherein a number of the connection lines disposed on a first row intersecting the outer column is different from a number of the connection lines disposed on a second row different from the first row.

17. The display apparatus of claim 16, further comprising:
an organic insulating layer disposed between the first outer pixel circuit and the first display element and including a first organic insulating layer, a second organic insulating layer, and a third organic insulating layer sequentially stacked each other, wherein
the connection lines include at least one of a lower connection line and an upper connection line,
the lower connection line is disposed between the first organic insulating layer and the second organic insulating layer, and
the upper connection line is disposed between the second organic insulating layer and the third organic insulating layer.

18. The display apparatus of claim 15, further comprising:
a first connection line extending from the outer column to the second inner column and electrically connecting the second outer pixel circuit to the second outer display element; and
a second connection line extending from the first inner column to the second inner column and electrically connecting the second inner pixel circuit to the second inner display element,
wherein the first inner column is disposed between the outer column and the second inner column.

19. The display apparatus of claim 11, further comprising:
a third display element disposed in the third region and including an emission area smaller than at least one of an emission area of the first display element and an emission area of the second display element.

20. The display apparatus of claim 11, wherein the second region extends along an outer periphery of the first region.

* * * * *